(12) United States Patent
Matsui et al.

(10) Patent No.: US 11,668,974 B2
(45) Date of Patent: *Jun. 6, 2023

(54) ILLUMINATION UNIT AND DISPLAY APPARATUS

(71) Applicant: Saturn Licensing LLC, New York, NY (US)

(72) Inventors: Hiroaki Matsui, Tokyo (JP); Takashi Ikuta, Selangor Darul Ehsan (MY)

(73) Assignee: SATURN LICENSING LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/520,110

(22) Filed: Nov. 5, 2021

(65) Prior Publication Data

US 2022/0057675 A1    Feb. 24, 2022

Related U.S. Application Data

(63) Continuation of application No. 17/108,249, filed on Dec. 1, 2020, now Pat. No. 11,194,192, which is a
(Continued)

(30) Foreign Application Priority Data

May 15, 2017    (JP) .................................. 2017-096227

(51) Int. Cl.
*G02F 1/13357* (2006.01)
*G09G 3/34* (2006.01)
(Continued)

(52) U.S. Cl.
CPC ....... *G02F 1/133603* (2013.01); *G09G 3/342* (2013.01); *F21Y 2105/16* (2016.08); *G02F 1/133601* (2021.01)

(58) Field of Classification Search
CPC ........................... G09G 3/342; G09G 3/3426; G02F 1/133603; G02F 1/133601; F21Y 2105/16
See application file for complete search history.

(56) References Cited

U.S. PATENT DOCUMENTS 7,732,230 B2    6/2010    Yamamoto
7,932,524 B2    4/2011    Repetto et al.
(Continued)

FOREIGN PATENT DOCUMENTS

CN    1855481    11/2006
JP    2006030309 A    2/2006
(Continued)

OTHER PUBLICATIONS

International Search Report based on PCT/JP2018/010750, dated May 15, 2018, 3 pgs.

*Primary Examiner* — Alexander K Garlen
(74) *Attorney, Agent, or Firm* — Richard LaPeruta

(57) ABSTRACT

An illumination unit according to the present disclosure includes a plurality of first light-emission blocks, a plurality of second light-emission blocks, and a light-emission controller. The first light-emission blocks each include a plurality of first light-emitting devices arranged in a first direction. The second light-emission blocks are partially overlapped with the respective first light-emission blocks, and each include a plurality of second light-emitting devices arranged in a second direction different from the first direction. The light-emission controller performs light-emission control of the first light-emitting devices for each of the first light-emission blocks, and performs the light-emission control of the second light-emitting devices for each of the second light-emission blocks.

16 Claims, 25 Drawing Sheets

Related U.S. Application Data continuation of application No. 16/496,690, filed as application No. PCT/JP2018/010750 on Mar. 19, 2018, now Pat. No. 10,871,676.

(51) Int. Cl.
*F21Y 105/16* (2016.01)
*G02F 1/1335* (2006.01)

(56) References Cited

U.S. PATENT DOCUMENTS

| | | |
|---|---|---|
| 2003/0223236 A1 | 12/2003 | Wu |
| 2006/0002143 A1 | 1/2006 | Gu et al. |
| 2009/0315921 A1* | 12/2009 | Sakaigawa ............ G09G 3/3413 345/694 |
| 2010/0207849 A1 | 8/2010 | Cok et al. |
| 2010/0231573 A1 | 9/2010 | Adachi |
| 2011/0280002 A1 | 11/2011 | Furukawa |
| 2014/0218969 A1 | 8/2014 | Kjaer et al. |
| 2015/0206507 A1 | 7/2015 | Kwon et al. |
| 2016/0252231 A1 | 9/2016 | Fujikawa et al. |
| 2017/0365225 A1 | 12/2017 | Yoneyama |

FOREIGN PATENT DOCUMENTS

| | | |
|---|---|---|
| JP | 2008164863 A | 7/2008 |
| JP | 2009139931 A | 6/2009 |
| JP | 2009294436 A | 12/2009 |
| JP | 201055998 A | 3/2010 |
| JP | 2011242604 A | 12/2011 |
| JP | 2011243330 A | 12/2011 |
| JP | 2013157225 | 8/2013 |
| JP | 2013157255 A | 8/2013 |
| JP | 2016164853 A | 9/2016 |

\* cited by examiner

[FIG. 2]
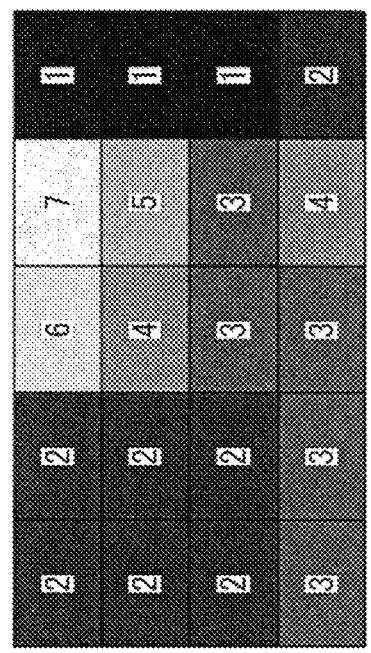
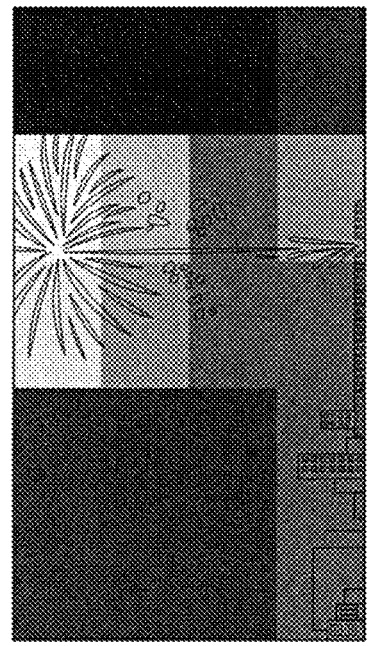

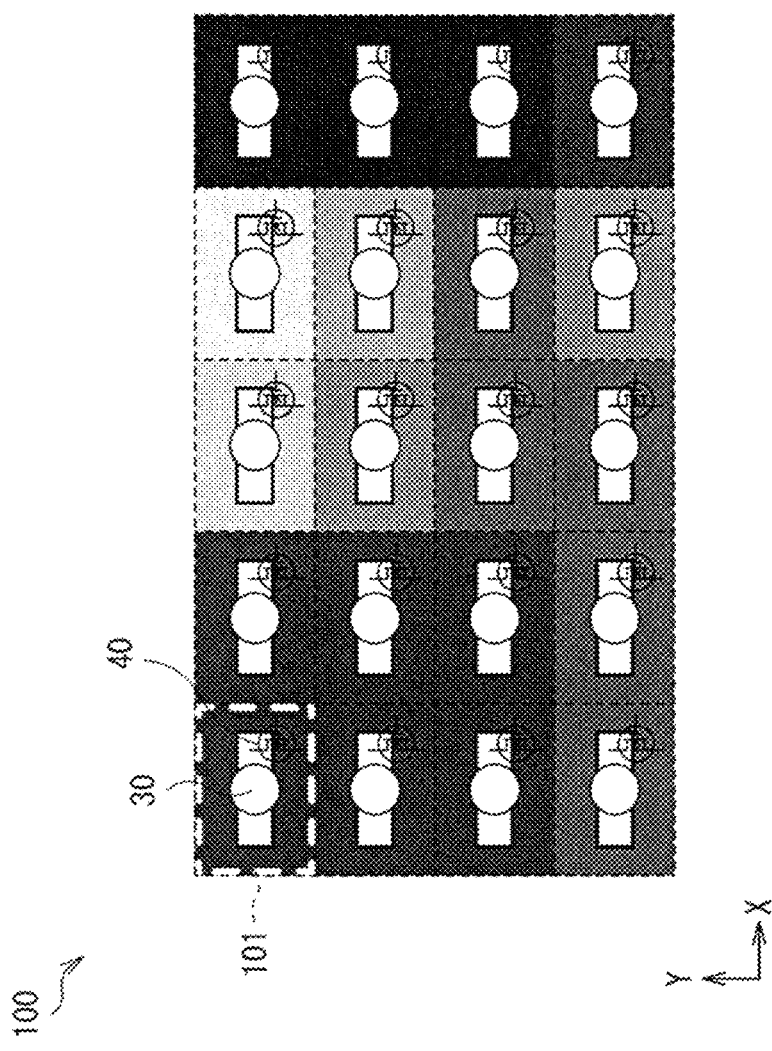
[ FIG. 3 ]

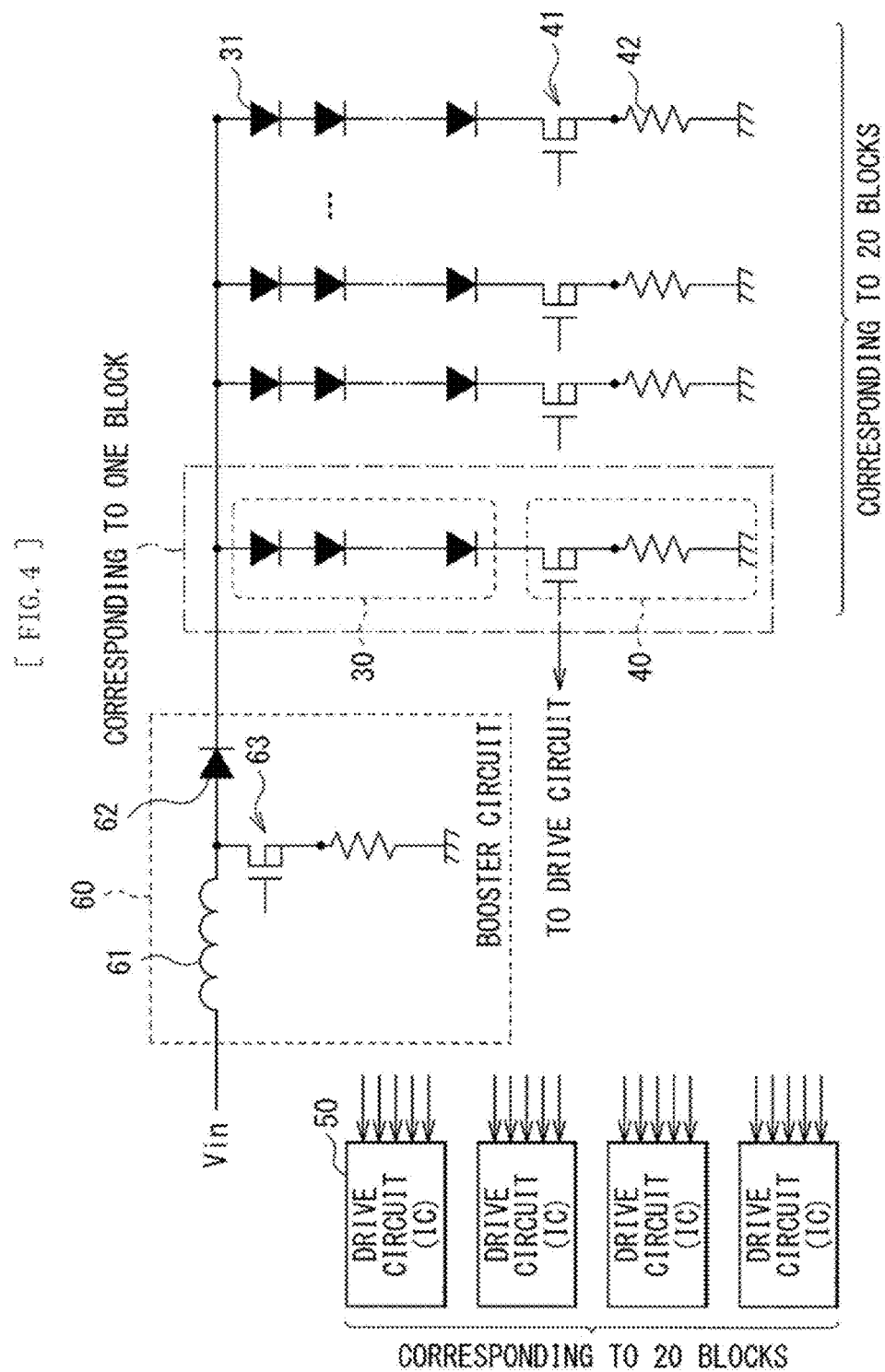
[FIG. 4]

[ FIG. 5 ]
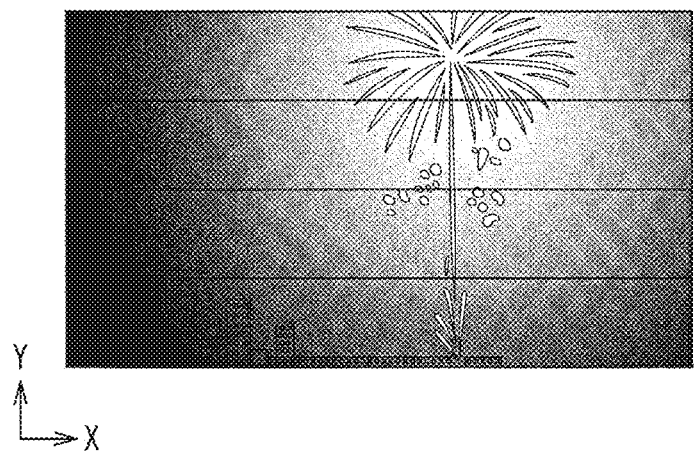
[ FIG. 6 ]
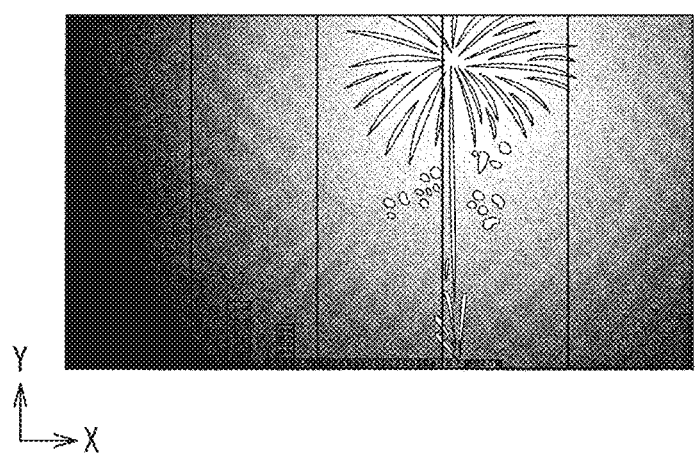

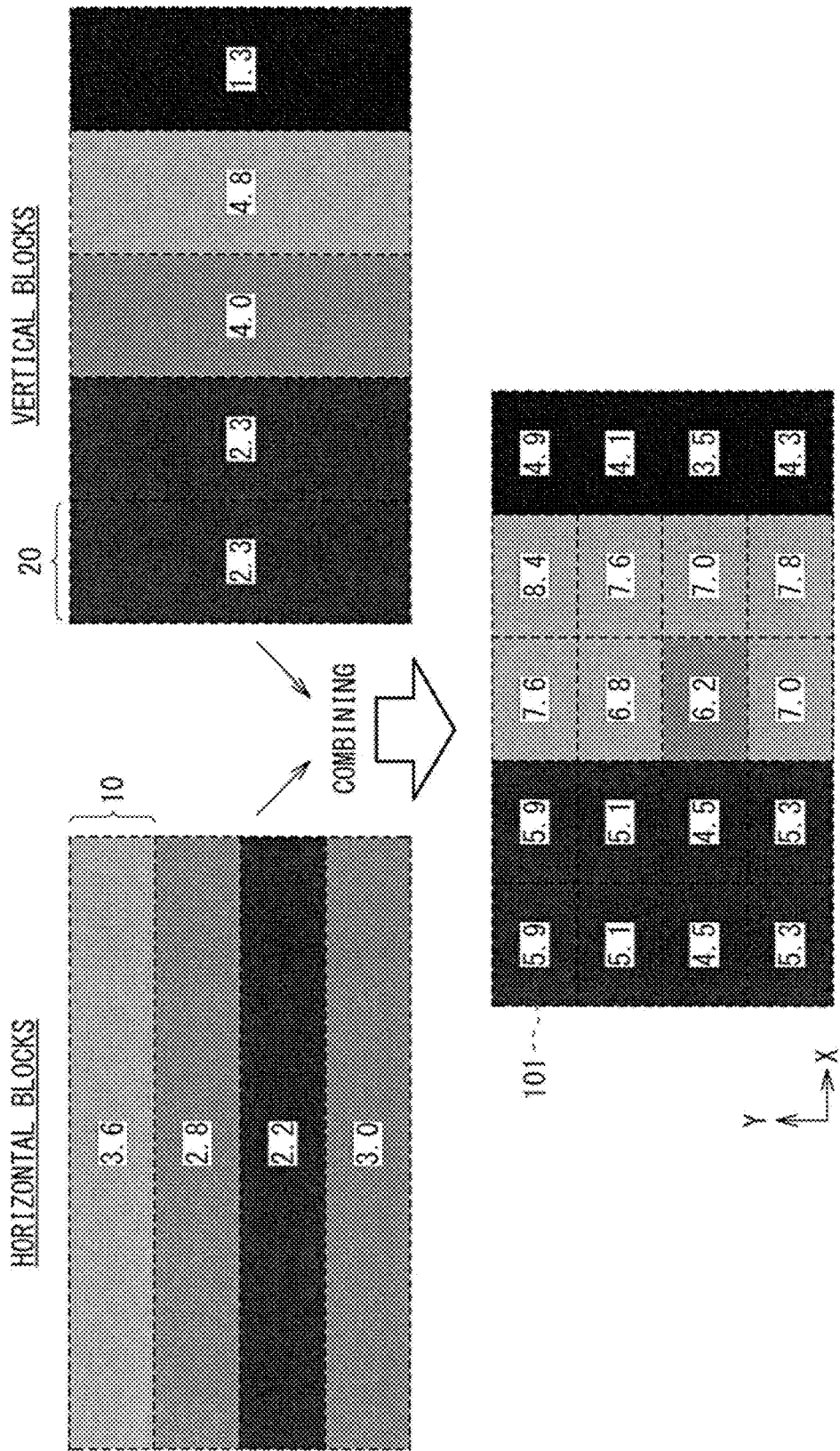

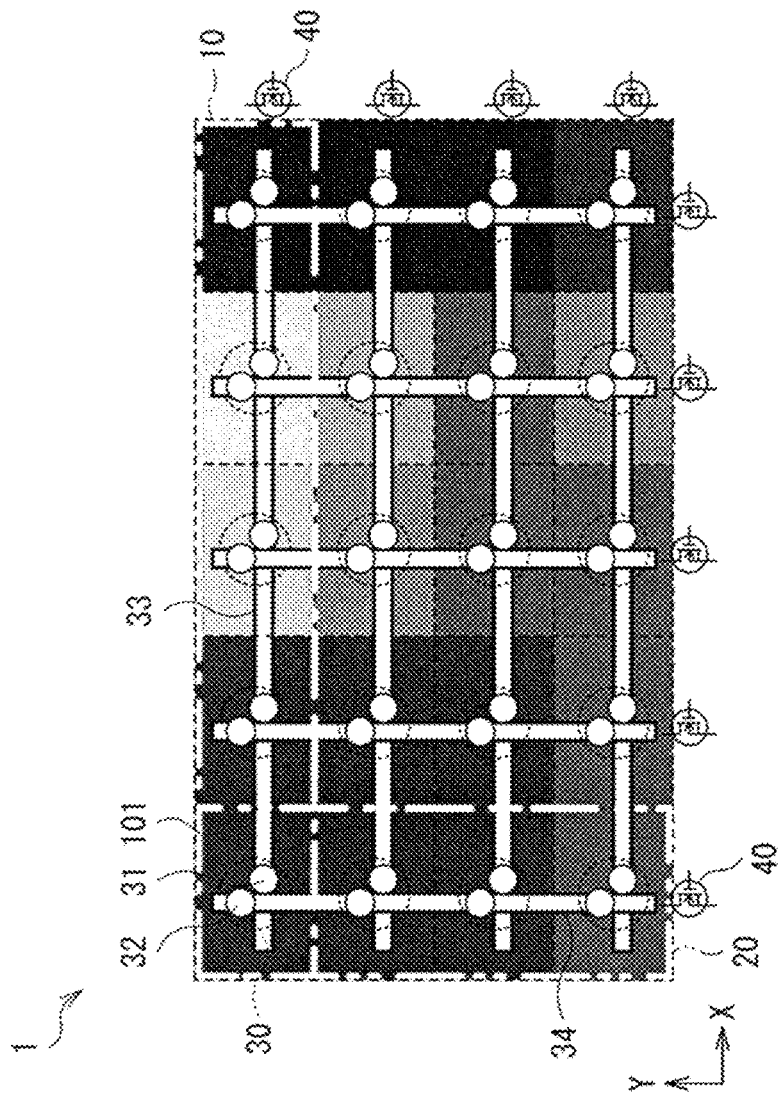

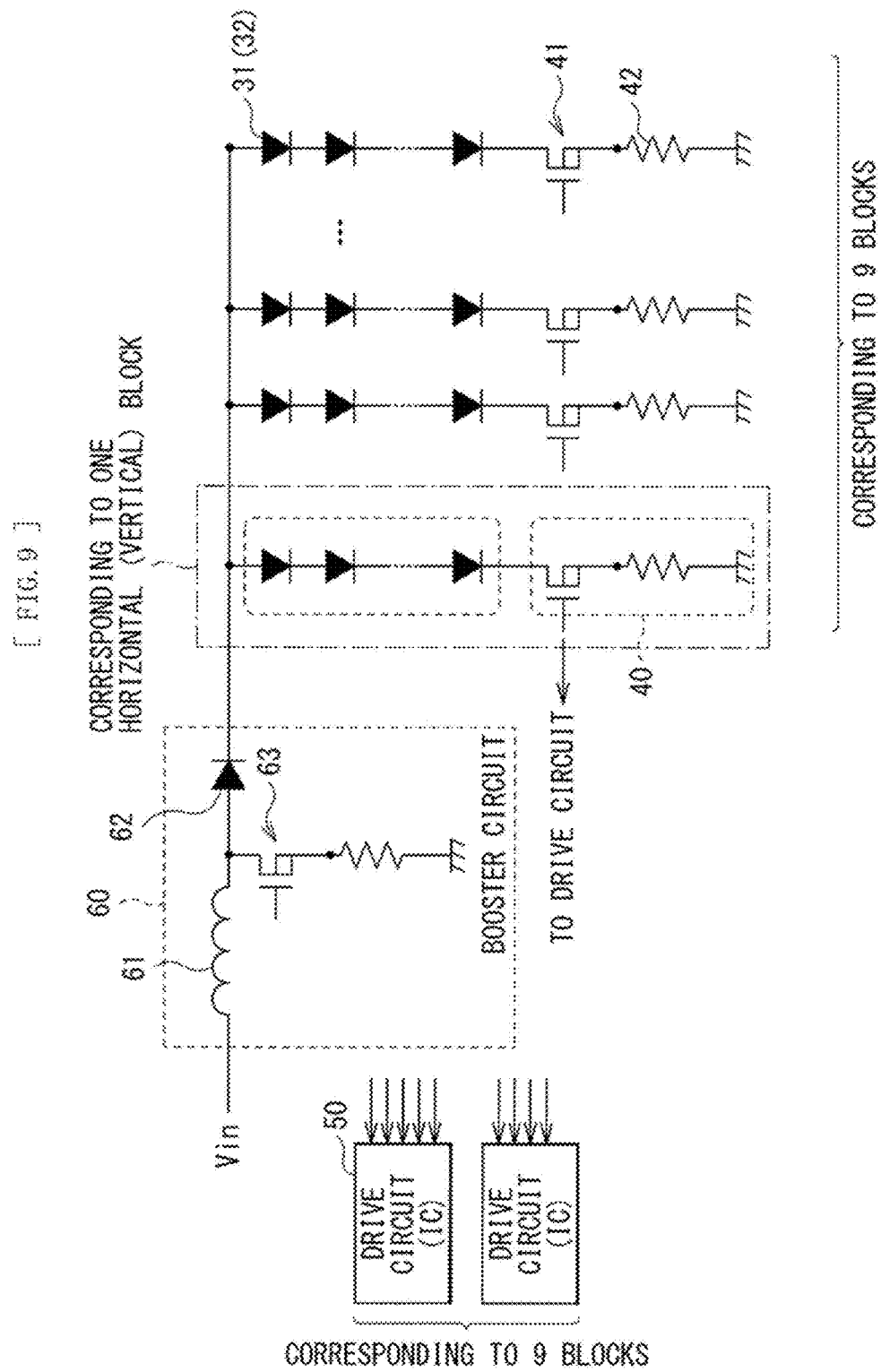

[FIG. 10]
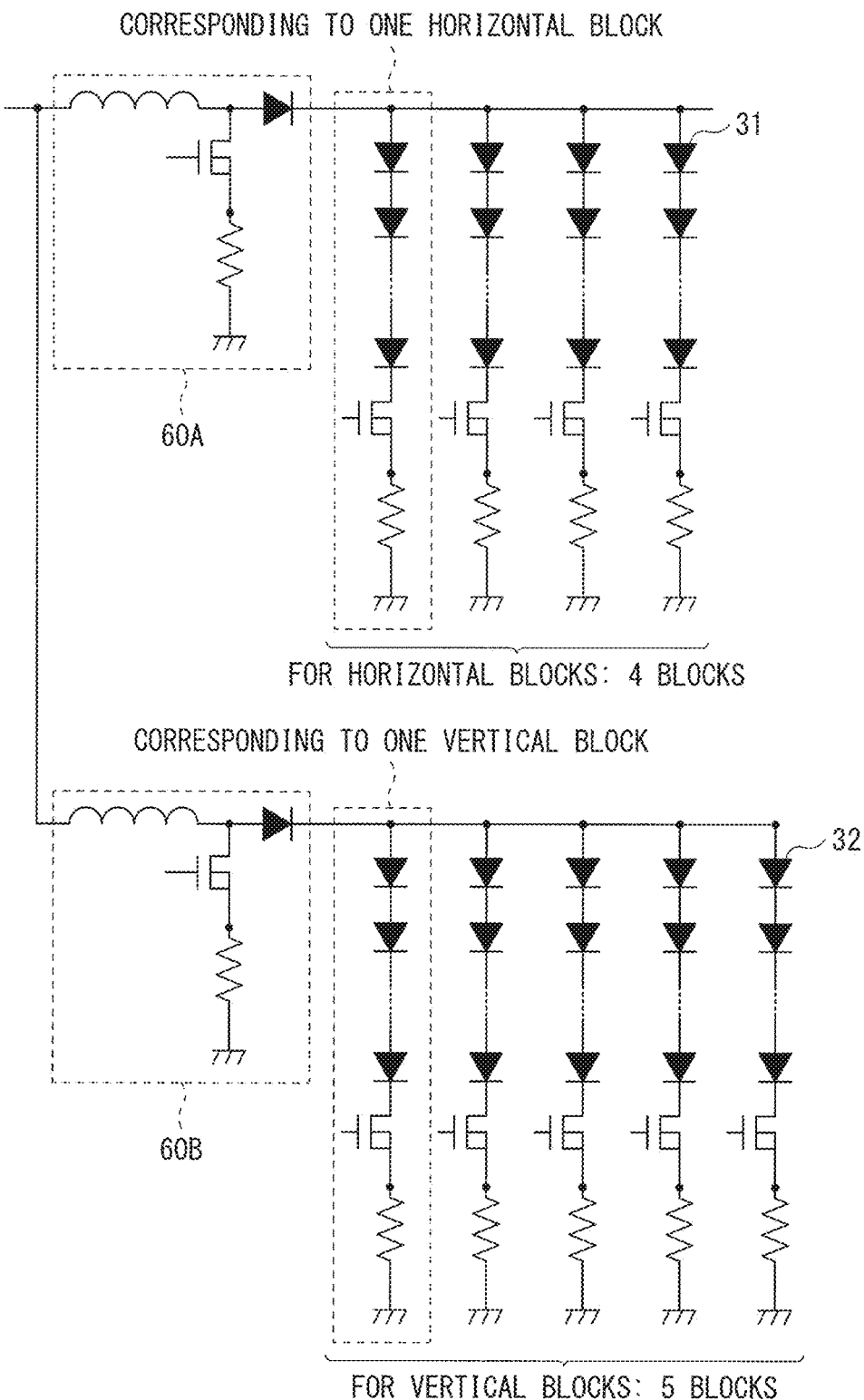

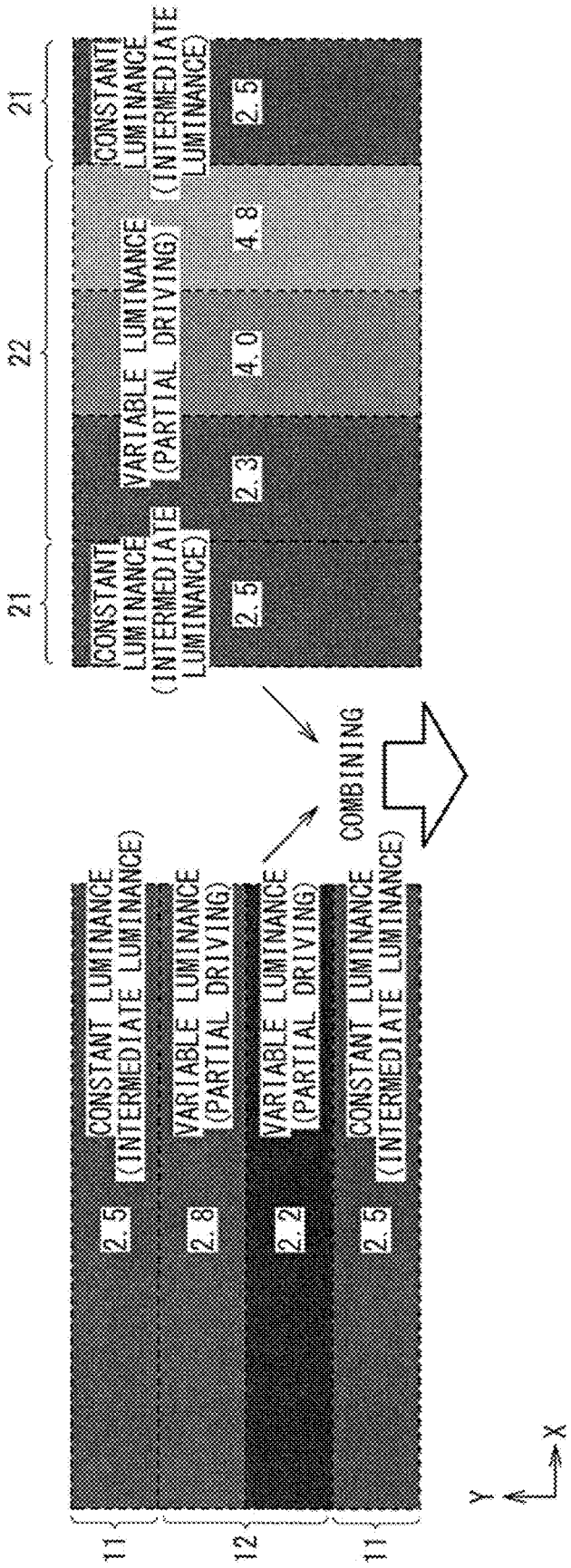
[FIG. 11]

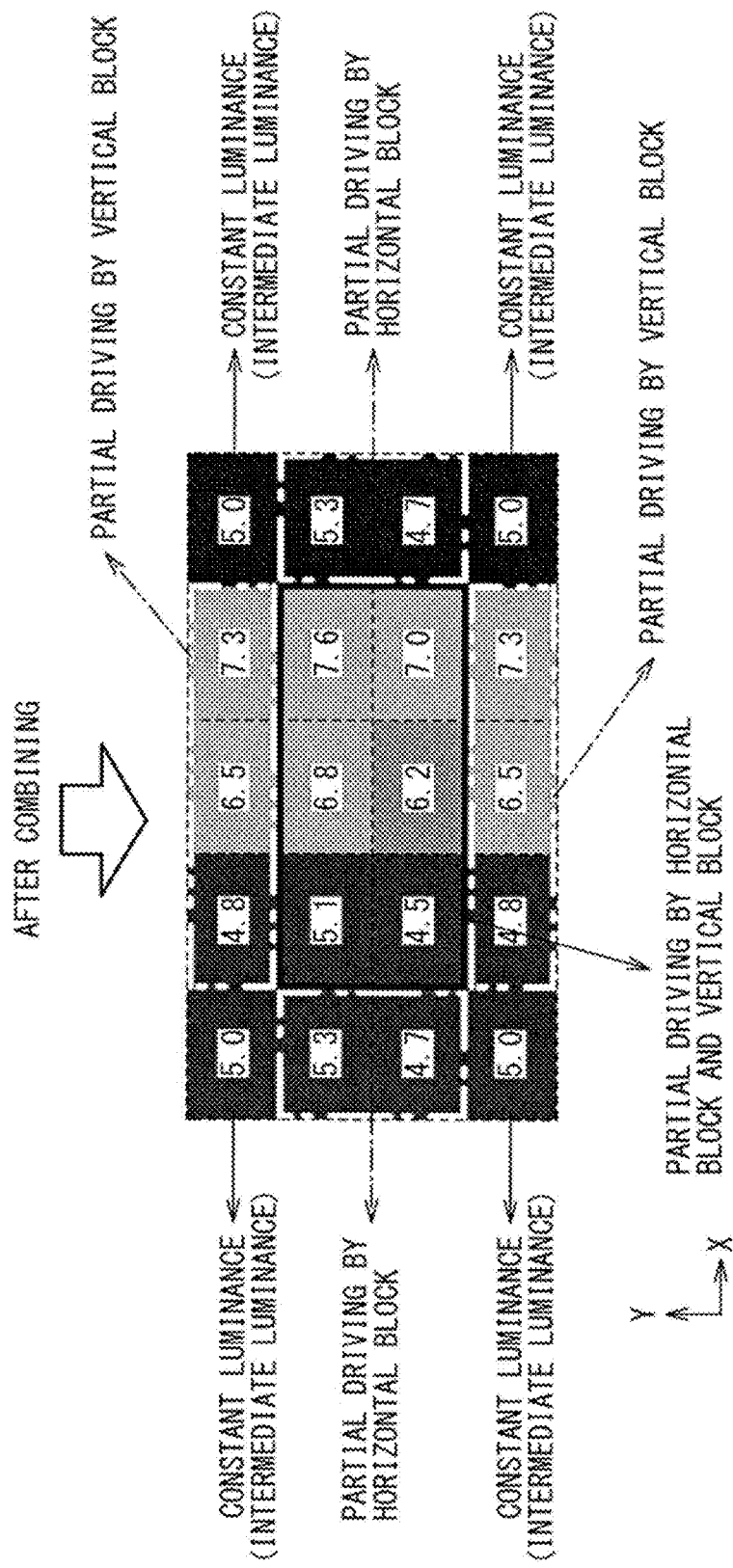

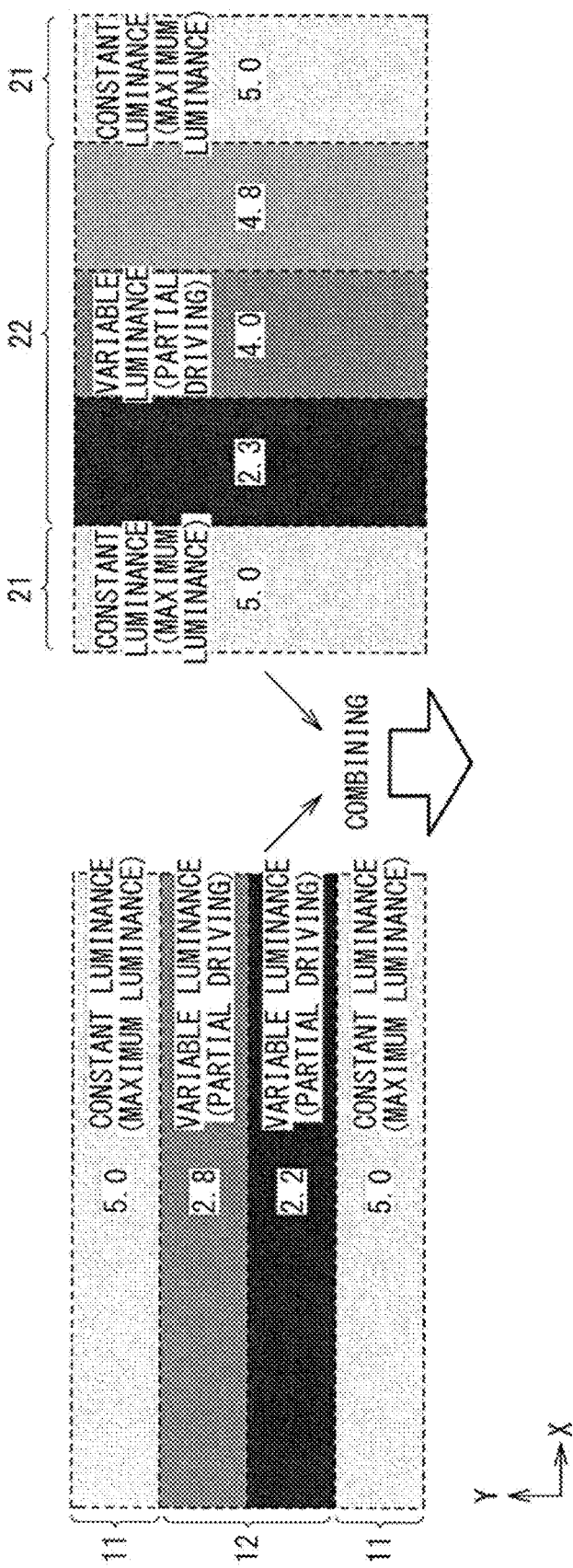

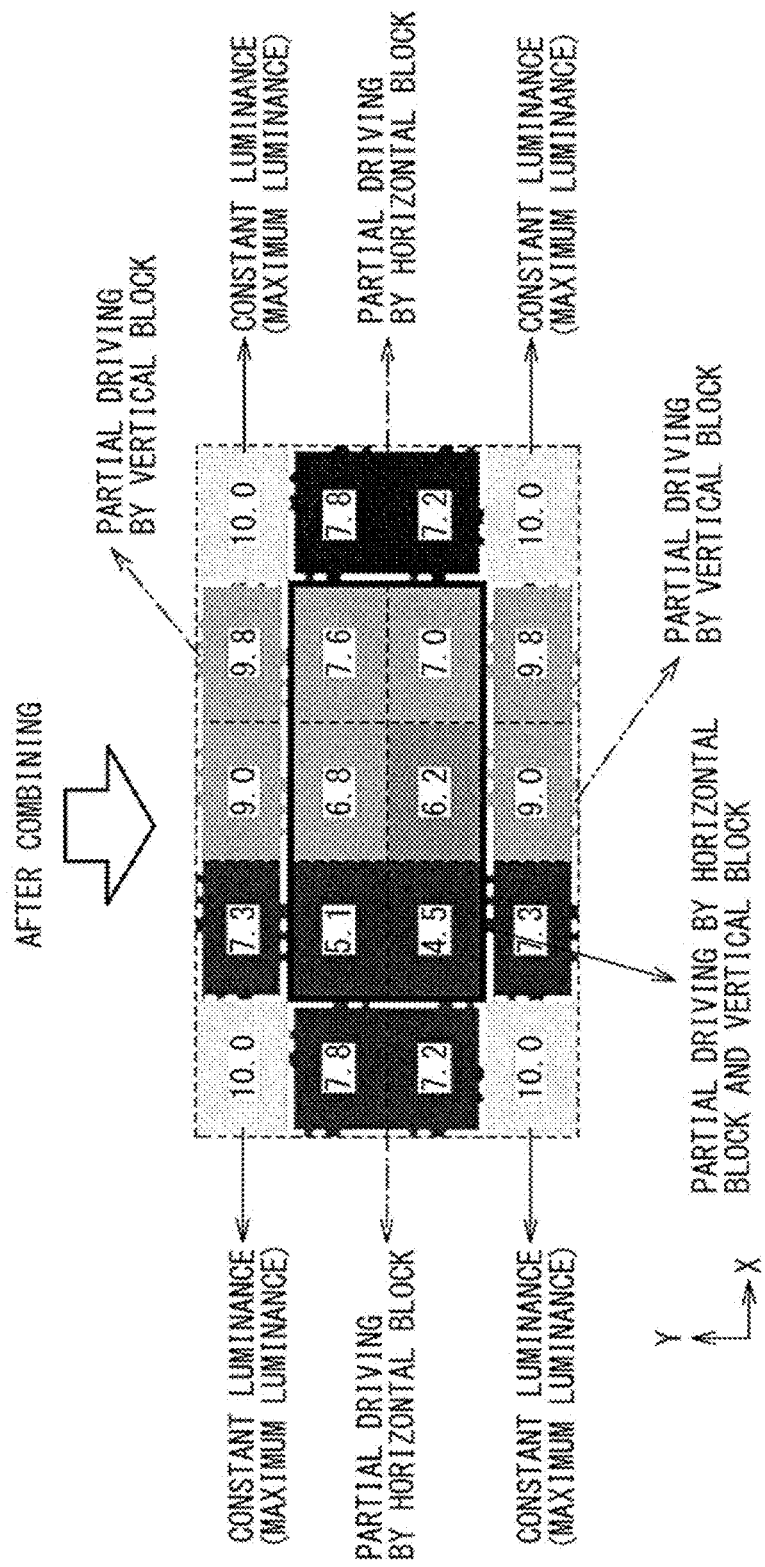

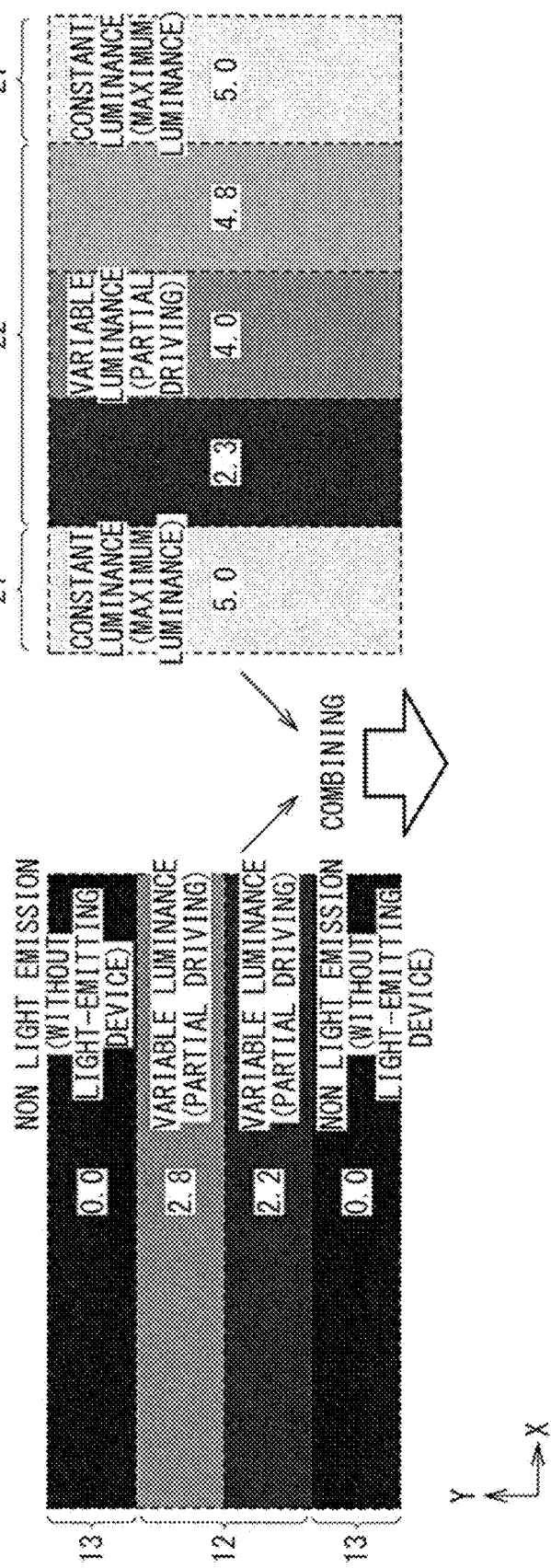
[FIG. 15]

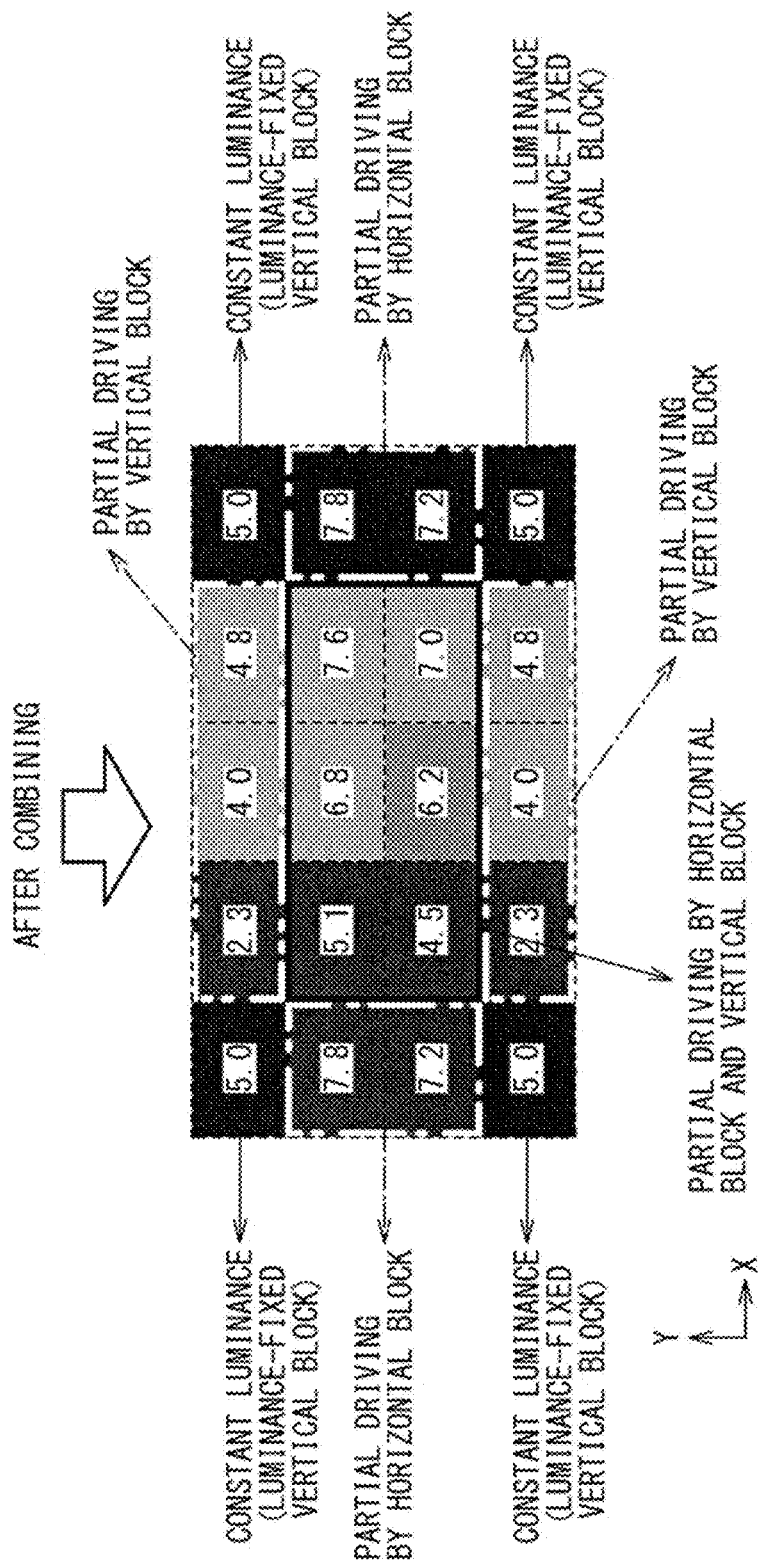
[FIG. 16]

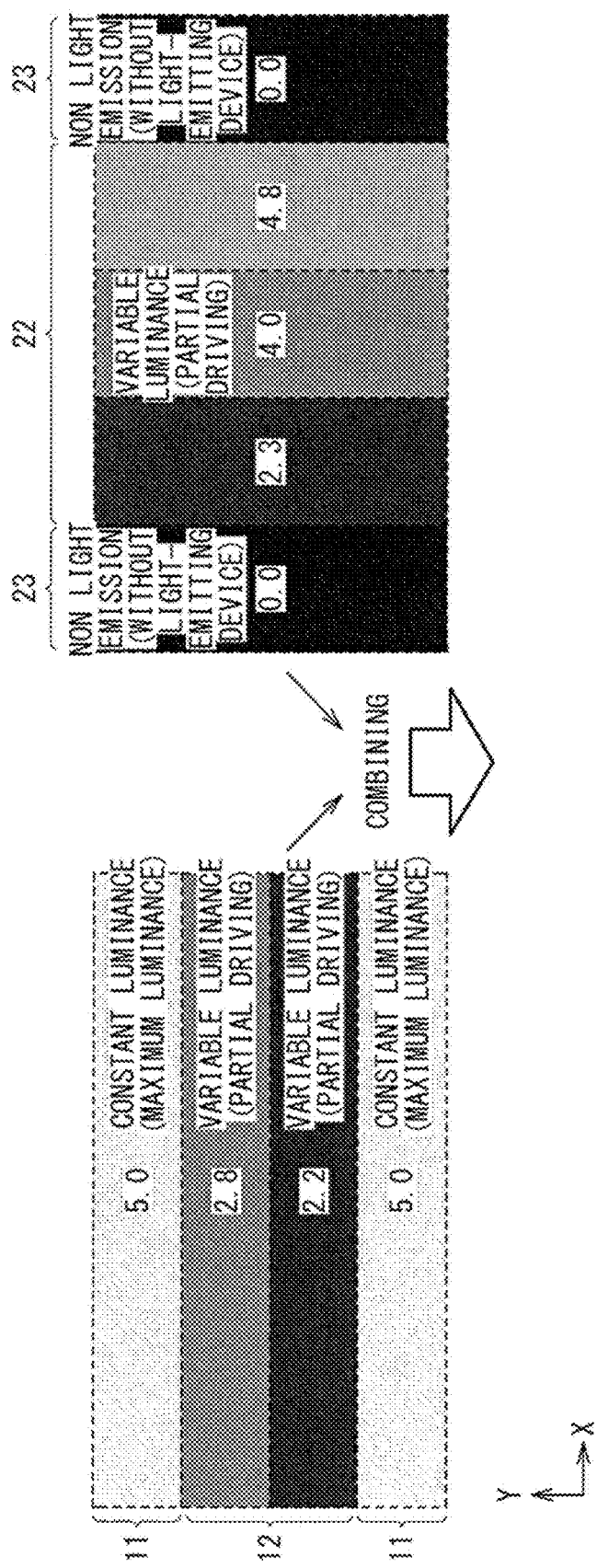

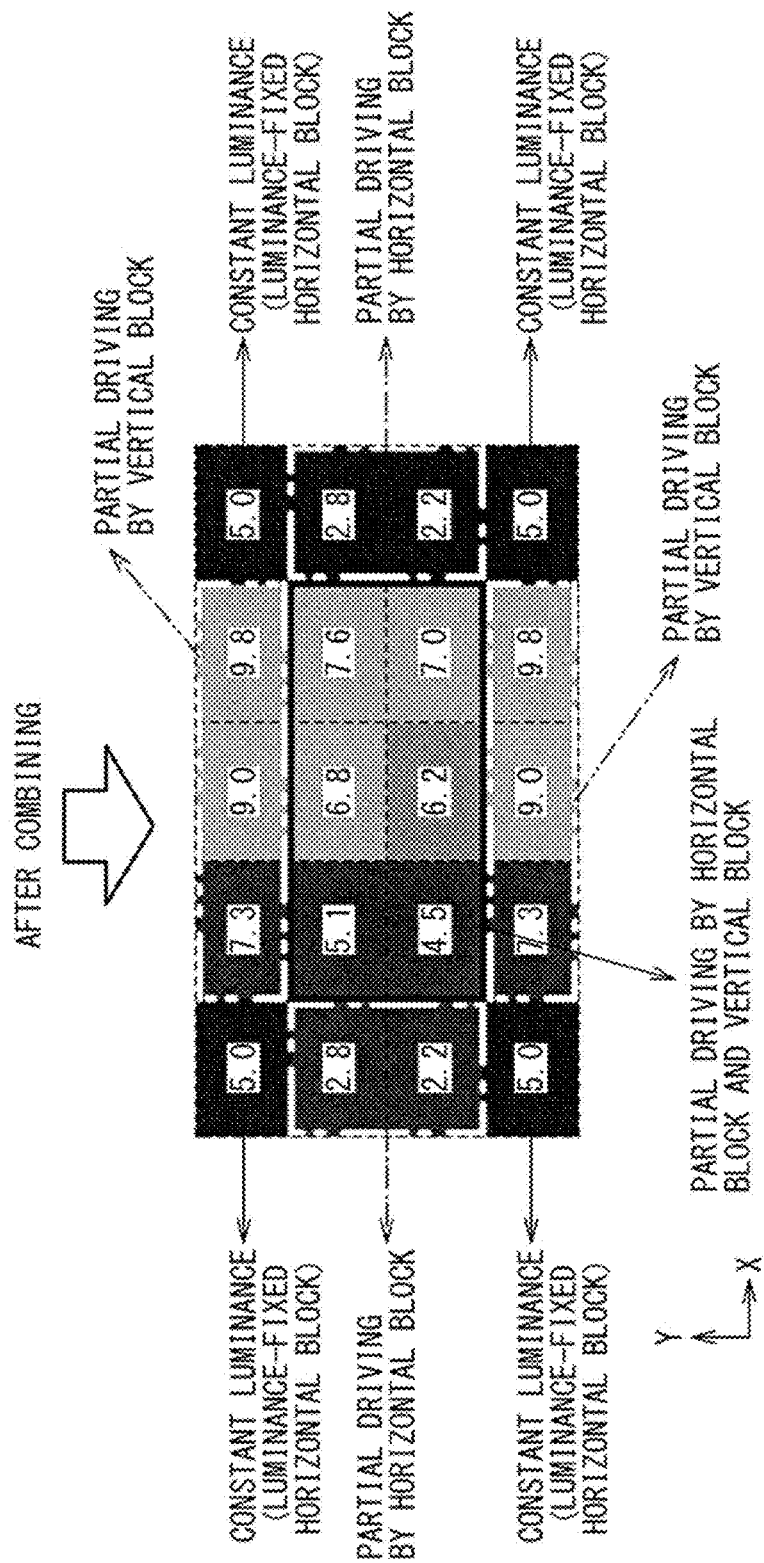

[ FIG. 19 ]
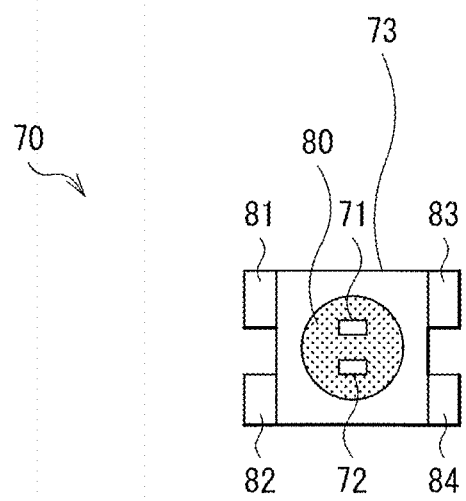
[ FIG. 20 ]
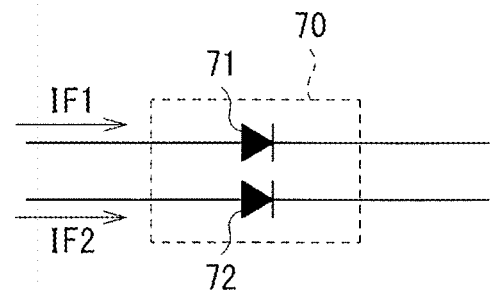

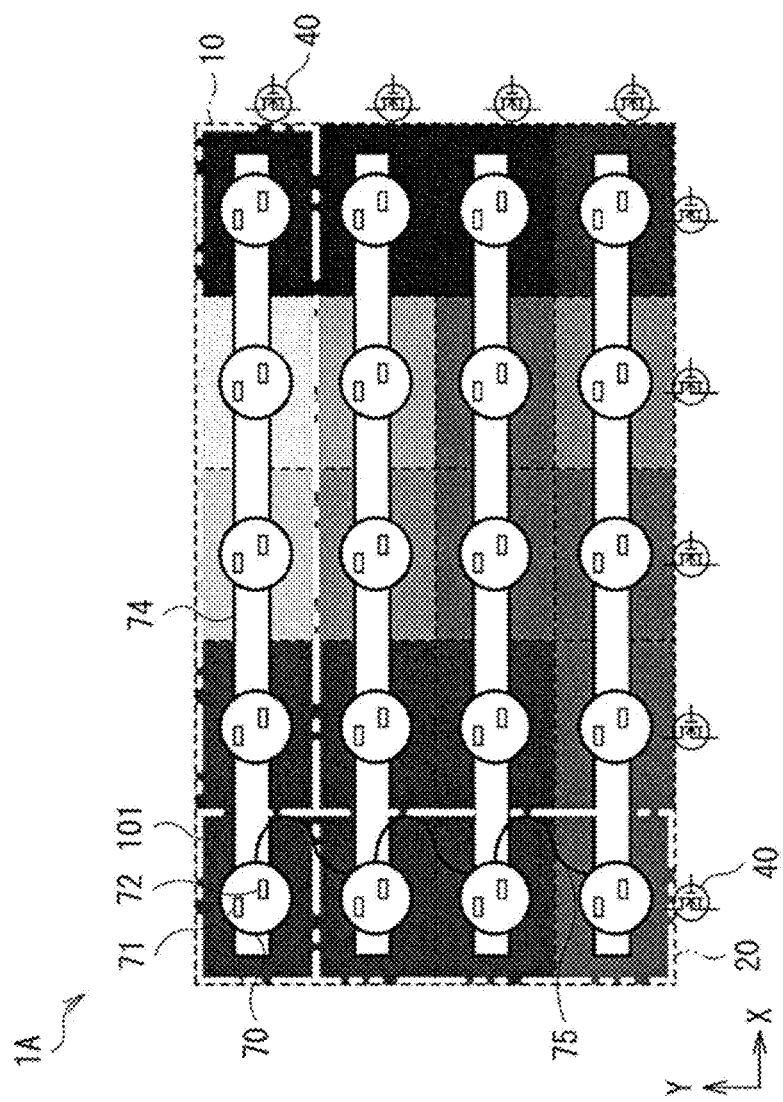
[FIG. 21]

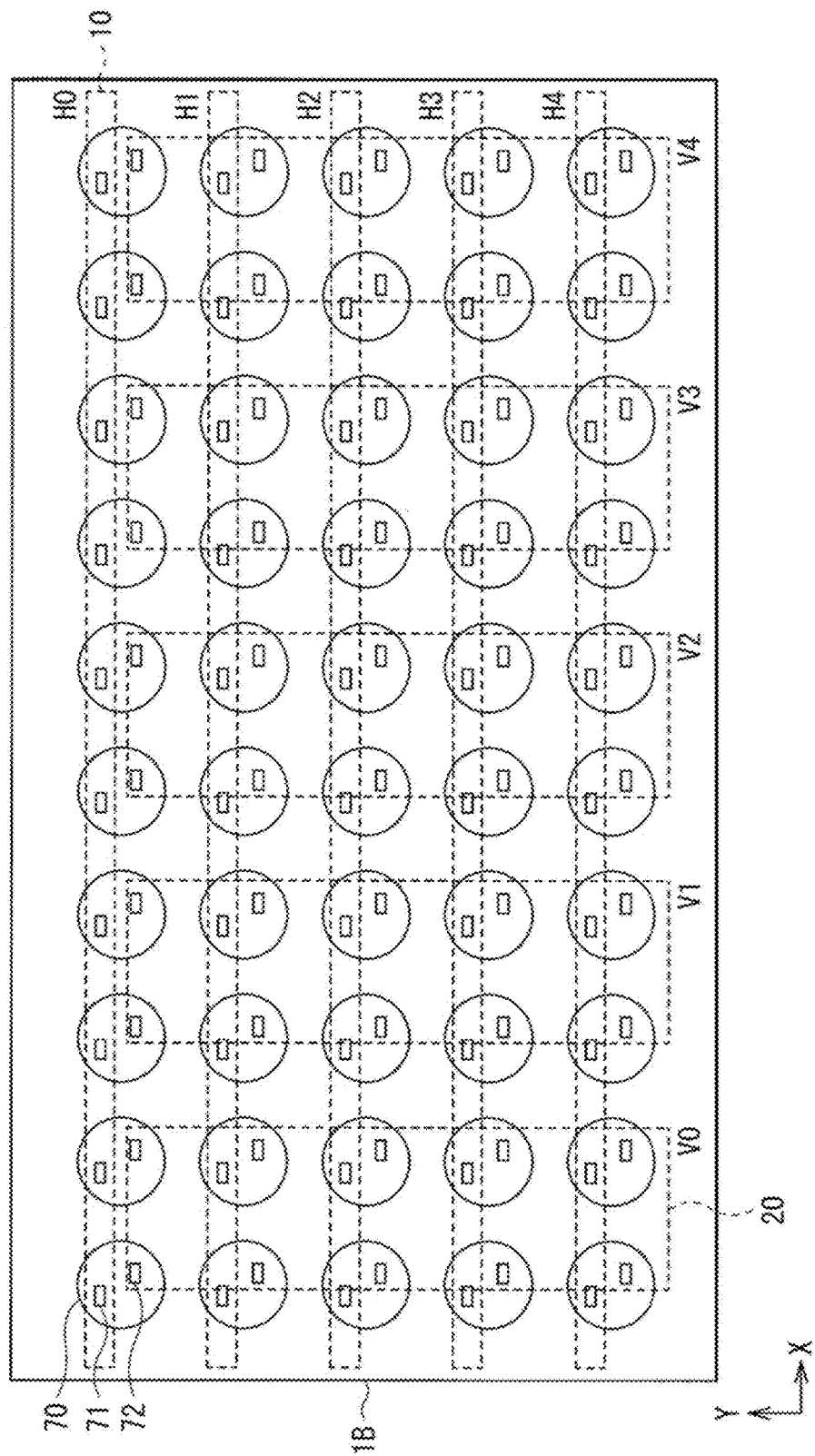

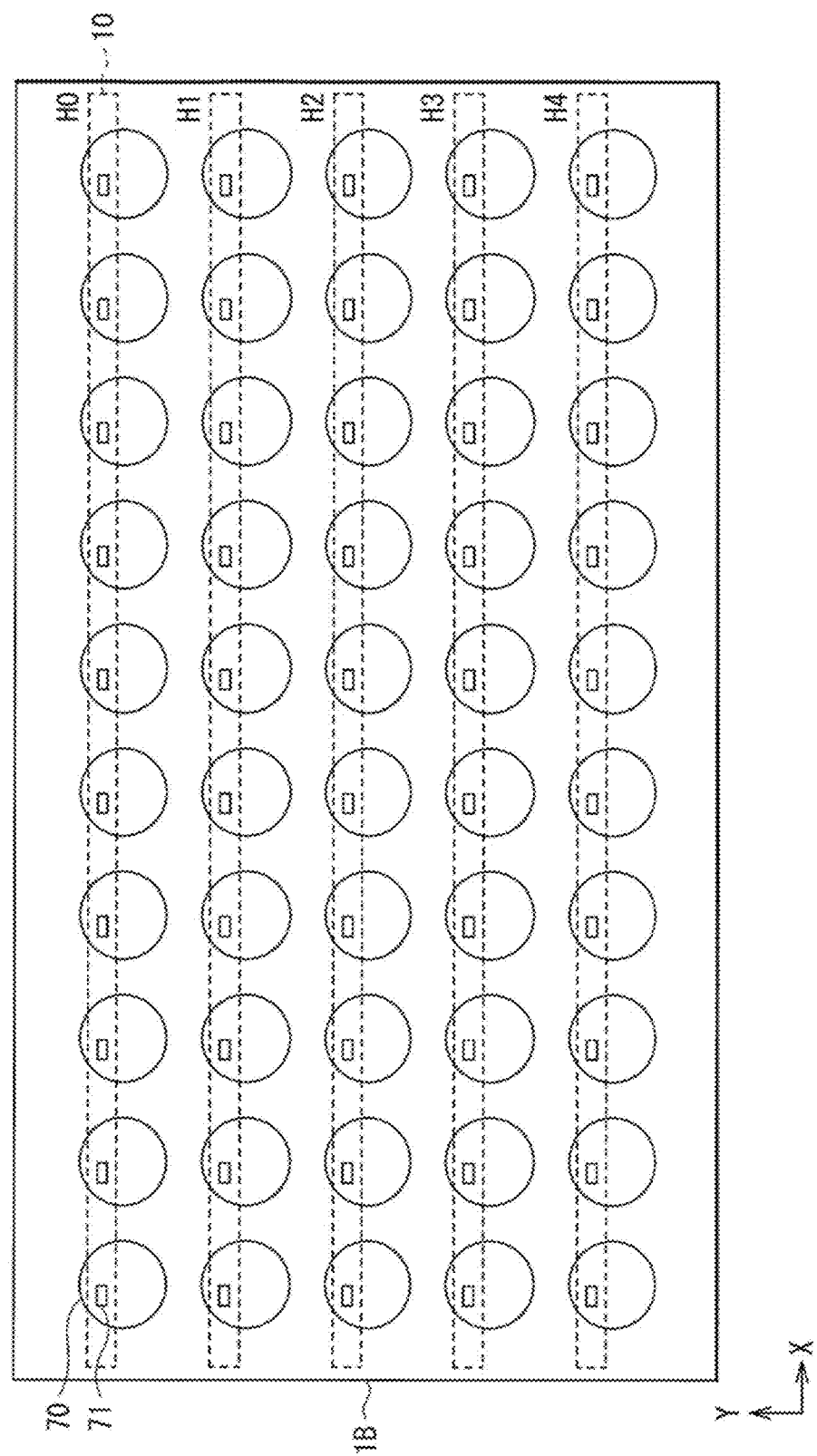

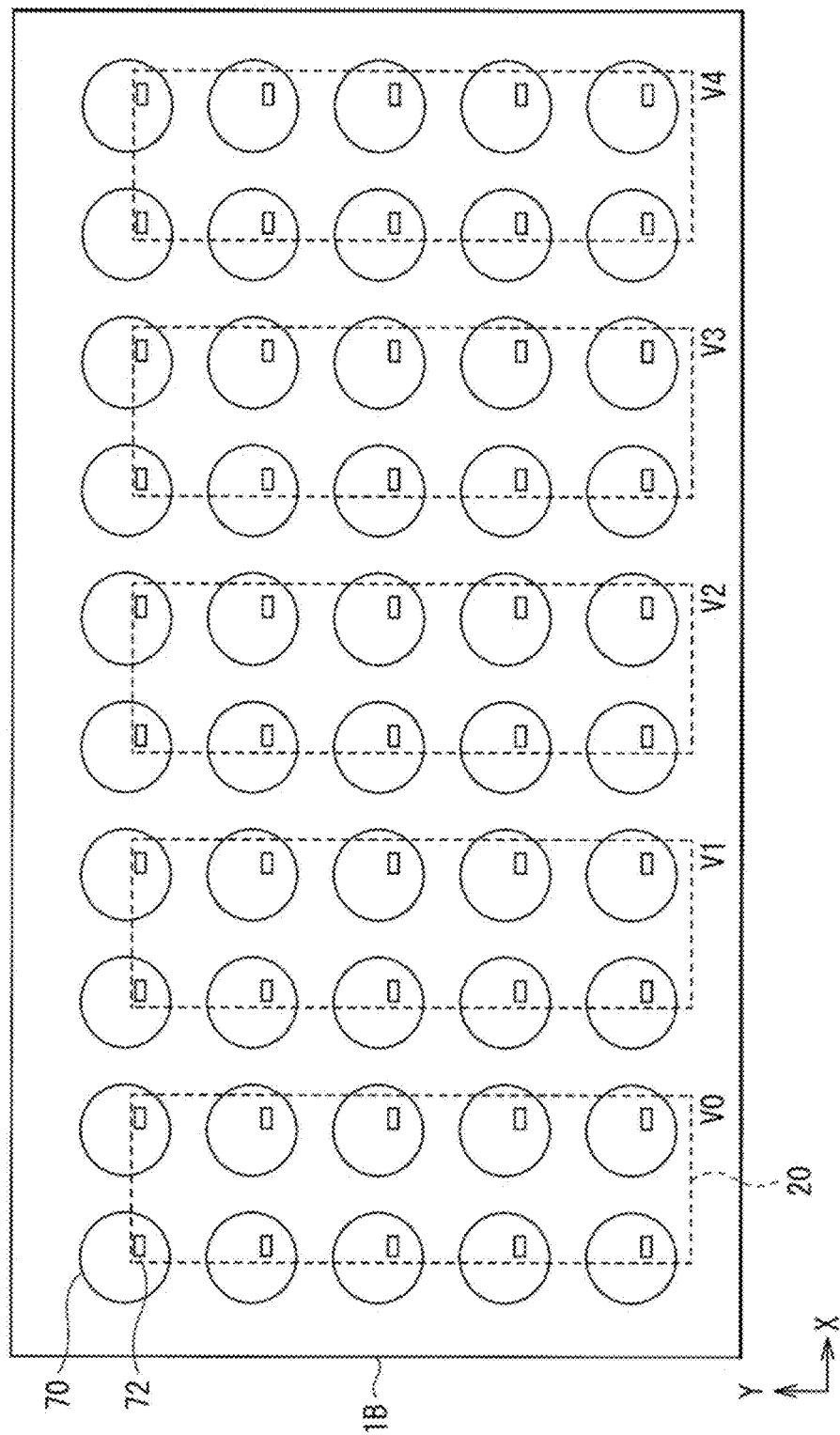
[ FIG. 24 ]

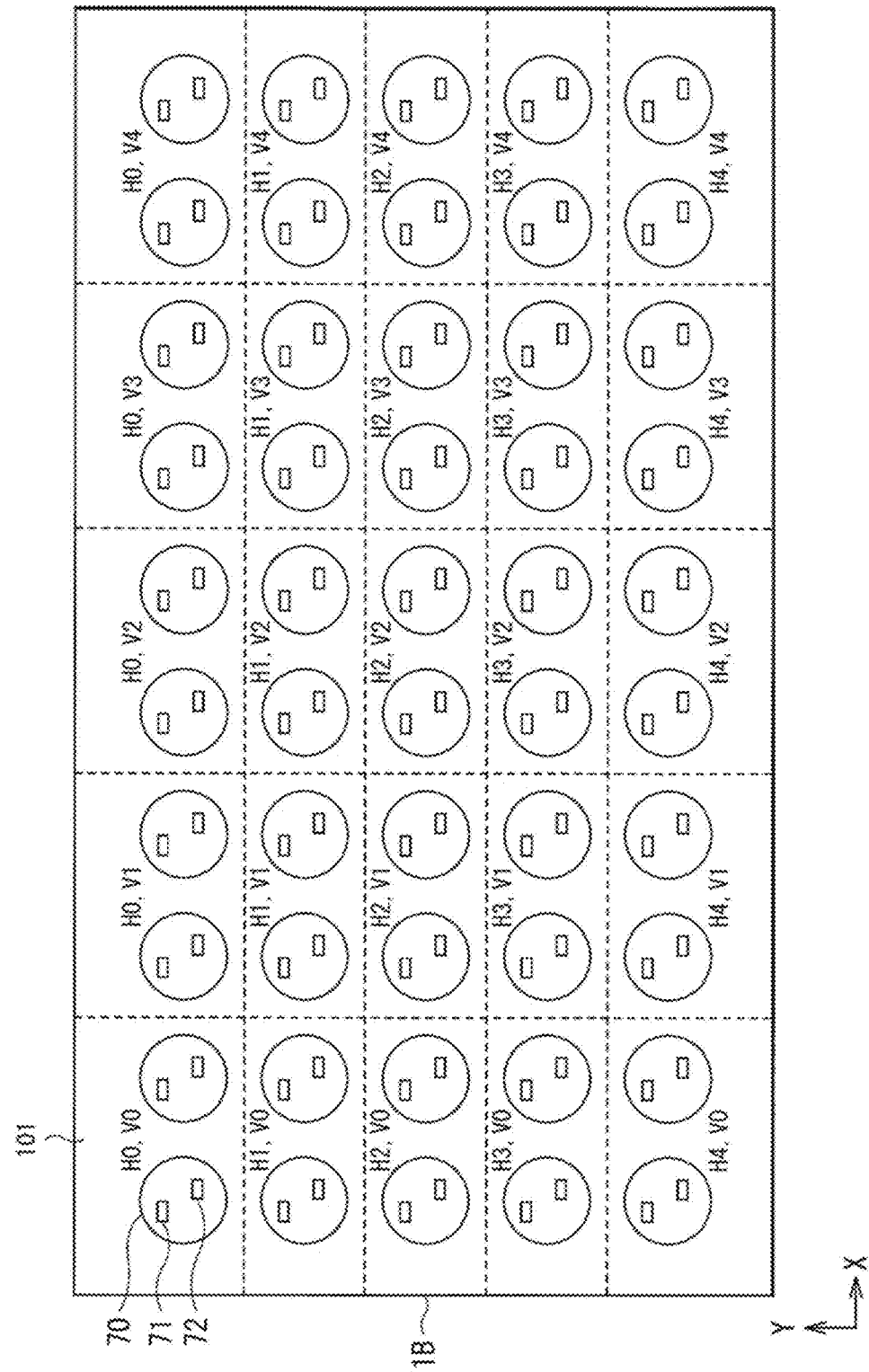
[ FIG. 25 ]

[ FIG. 26 ]
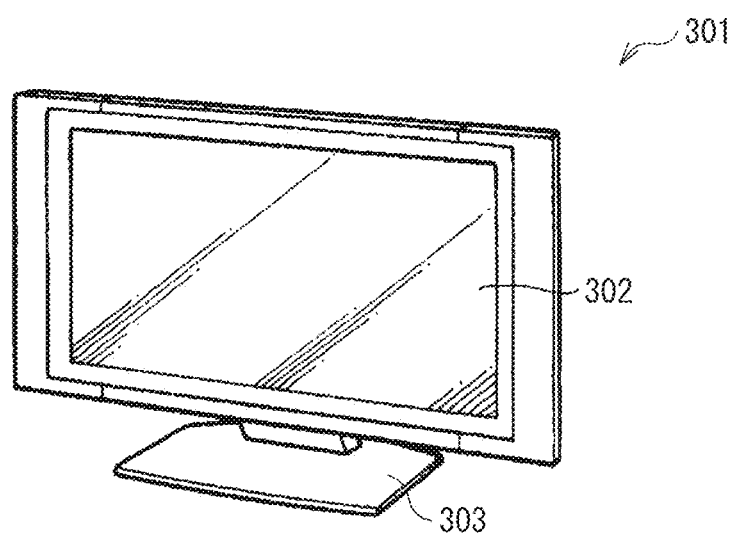

[ FIG. 27 ]
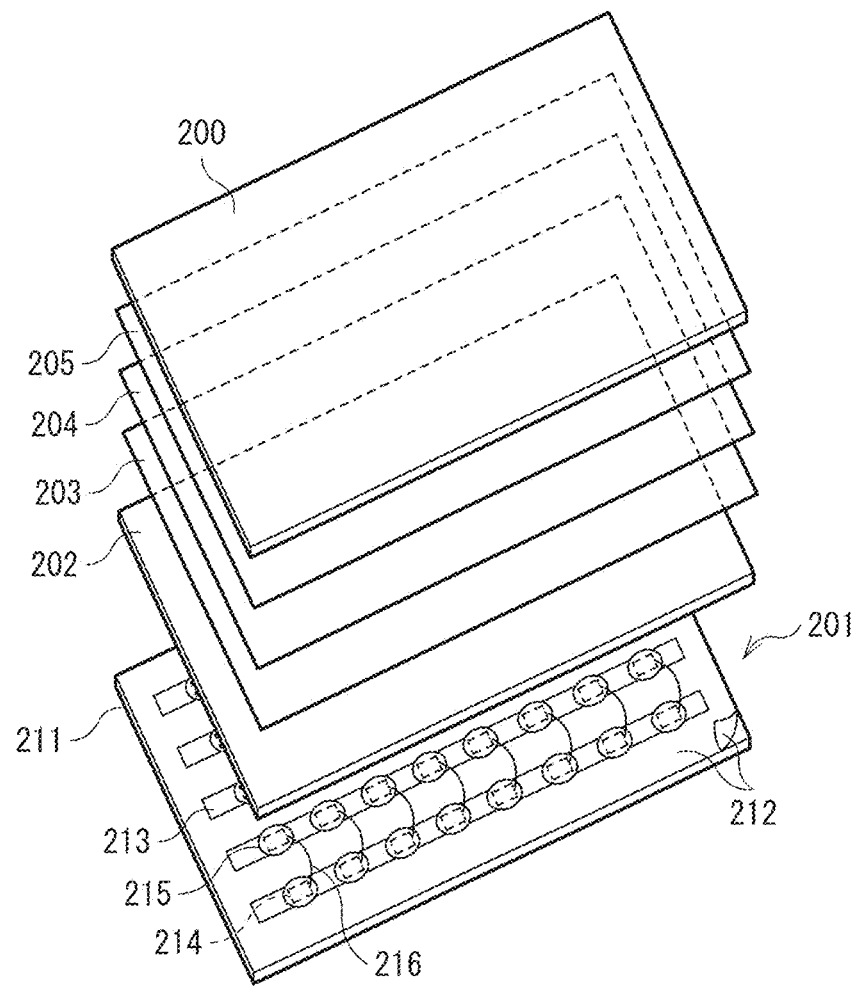

ILLUMINATION UNIT AND DISPLAY APPARATUS

CROSS-REFERENCE TO RELATED APPLICATIONS

The present application is a continuation of U.S. patent application Ser. No. 17/108,249, filed on Dec. 1, 2020, which is a continuation of U.S. patent application Ser. No. 16/496,690, filed on Sep. 23, 2019, issued as U.S. Pat. No. 10,871,676, which is a national phase entry under 35 U.S.C. § 371 of International Application No. PCT/JP2018/010750, filed on Mar. 19, 2018, which claims the benefit of Japanese Priority Patent Application No. 2017-096227 filed with the Japan Patent Office on May 15, 2017, the disclosures of which are hereby incorporated herein by reference.

TECHNICAL FIELD

The present disclosure relates to an illumination unit and a display apparatus.

BACKGROUND ART

A method has been known that increases a contrast in a display apparatus in which a backlight is used, such as a liquid crystal display. One method is a partial driving control or a "local dimming" control in which a light-emission region of the backlight is divided into a plurality of partial light-emission blocks and a light-emission control is performed for each of the partial light-emission blocks.

SUMMARY OF THE INVENTION

Upon performing a partial driving control of a backlight, drive circuits corresponding to the number of partial light-emission blocks may be necessary.

It is desirable to provide an illumination unit and a display apparatus that are able to simplify a circuit configuration directed to a partial driving control.

An illumination unit according to an embodiment of the present disclosure includes: a plurality of first light-emission blocks each including a plurality of first light-emitting devices arranged in a first direction; a plurality of second light-emission blocks partially overlapped with the respective first light-emission blocks, and each including a plurality of second light-emitting devices arranged in a second direction different from the first direction; and a light-emission controller that performs light-emission control of the first light-emitting devices for each of the first light-emission blocks, and performs the light-emission control of the second light-emitting devices for each of the second light-emission blocks.

A display apparatus according to an embodiment of the present disclosure includes: an illumination unit; and a display panel that displays an image on a basis of illumination light derived from the illumination unit. The illumination unit includes a plurality of first light-emission blocks each including a plurality of first light-emitting devices arranged in a first direction, a plurality of second light-emission blocks partially overlapped with the respective first light-emission blocks, and each including a plurality of second light-emitting devices arranged in a second direction different from the first direction, and a light-emission controller that performs light-emission control of the first light-emitting devices for each of the first light-emission blocks, and performs the light-emission control of the second light-emitting devices for each of the second light-emission blocks.

In the illumination unit or the display apparatus according to the embodiment of the present disclosure, the first light-emission blocks and the second light-emission blocks may be overlapped with one another respectively to form a plurality of partial light-emission blocks in the first direction and in the second direction.

The illumination unit or the display apparatus according to the embodiment of the present disclosure includes the plurality of first light-emission blocks and the plurality of second light-emission blocks partially overlapped with the respective first light-emission blocks. Hence, it is possible to simplify a circuit configuration directed to a partial driving control.

It is to be noted that an effect described herein is not necessarily limiting and may be any of effects described in the present disclosure.

BRIEF DESCRIPTION OF THE DRAWINGS

FIG. 2 describes an example of a method of dividing a light-emission region performed in a backlight according to the comparative example.

FIG. 3 schematically illustrates a configuration of an illumination unit according to the comparative example.

FIG. 4 is a circuit diagram illustrating an example of a circuit configuration of the illumination unit according to the comparative example.

FIG. 5 describes an example of a method of dividing an image in a first direction performed by a display apparatus according to a first embodiment of the present disclosure.

FIG. 6 describes an example of a method of dividing the image in a second direction performed by the display apparatus according to the first embodiment.

FIG. 7 describes an outline of a partial driving control performed by an illumination unit according to the first embodiment.

FIG. 8 schematically illustrates a configuration of the illumination unit according to the first embodiment of the present disclosure.

FIG. 9 is a circuit diagram illustrating an example of a circuit configuration of the illumination unit according to the first embodiment.

FIG. 10 is a circuit diagram illustrating an example of a circuit configuration of an illumination unit according to a modification example of the first embodiment.

FIG. 11 describes a first example of a method of dividing a light-emission region performed by an illumination unit according to a second embodiment.

FIG. 12 describes an outline of a first example of a partial driving control performed by the illumination unit according to the second embodiment.

FIG. 13 describes a second example of the method of dividing the light-emission region performed by the illumination unit according to the second embodiment.

FIG. 14 describes an outline of a second example of the partial driving control performed by the illumination unit according to the second embodiment.

FIG. 15 describes a third example of the method of dividing the light-emission region performed by the illumination unit according to the second embodiment.

FIG. 16 describes an outline of a third example of the partial driving control performed by the illumination unit according to the second embodiment.

FIG. 17 describes a fourth example of the method of dividing the light-emission region performed by the illumination unit according to the second embodiment.

FIG. 18 describes an outline of a fourth example of the partial driving control performed by the illumination unit according to the second embodiment.

FIG. 19 schematically illustrates a configuration of an LED package to be used for an illumination unit according to a third embodiment.

FIG. 20 is a circuit diagram illustrating an equivalent circuit of the LED package illustrated in FIG. 19.

FIG. 21 schematically illustrates a configuration of the illumination unit according to the third embodiment in which the LED package illustrated in FIG. 19 is used.

FIG. 22 schematically illustrates a configuration of an illumination unit according to a fourth embodiment.

FIG. 23 schematically illustrates a configuration of horizontal blocks in the illumination unit according to the fourth embodiment.

FIG. 24 schematically illustrates a configuration of vertical blocks in the illumination unit according to the fourth embodiment.

FIG. 25 schematically describes partial light-emission blocks formed by the illumination unit according to the fourth embodiment.

FIG. 26 schematically illustrates a configuration of a display apparatus according to a fifth embodiment.

FIG. 27 is an exploded perspective view of an example of an internal configuration of the display apparatus according to the fifth embodiment.

MODES FOR CARRYING OUT THE INVENTION

In the following, some embodiments of the present disclosure are described in detail with reference to the accompanying drawings. It is to be noted that the description is given in the following order.
0. Comparative Example (FIGS. 1 to 4)
   0.1 Outline of Method of performing Partial Driving Control according to Comparative Example
   0.2 Outline of Illumination Unit according to Comparative Example
   0.3 Issue
1. First Embodiment (an illumination unit in which a circuit configuration directed to a partial driving control is simplified; FIGS. 5 to 10)
   1.1 Configuration and Operation
   1.2 Effects
2. Second Embodiment (an illumination unit in which a circuit configuration is further simplified; FIGS. 11 to 18)
3. Third Embodiment (an illumination unit in which an LED package is used; FIGS. 19 to 21)
4. Fourth Embodiment (an illumination unit in which two columns serve as one light-emission block; FIGS. 22 to 25)
5. Fifth Embodiment (an example in which an illumination unit is applied to a display apparatus; FIGS. 26 and 27)
6. Other Embodiments

0. COMPARATIVE EXAMPLE

Figure 1:
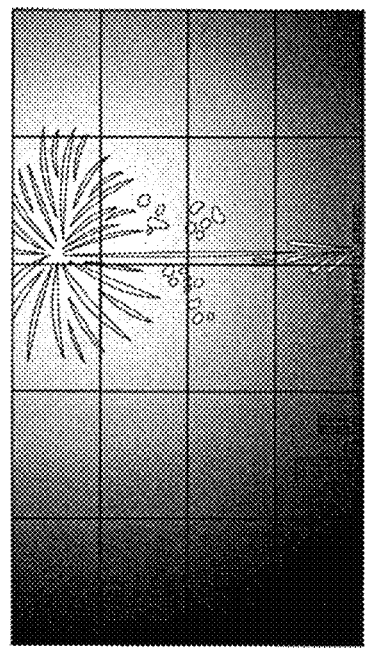
FIG. 1 describes an example of a method of dividing an image performed by a display apparatus according to a comparative example.
Figure 1:
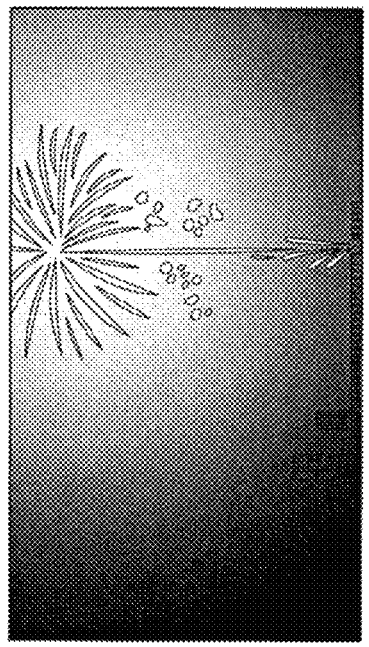
Figure 1:

0.1 Outline of Method of Performing Partial Driving Control According to Comparative Example FIG. 1 describes an example of a method of dividing an image performed by a display apparatus according to a comparative example. FIG. 2 describes an example of a method of dividing a light-emission region performed in a backlight according to the comparative example.

One example of a method that increases a contrast in a display apparatus in which a backlight is used, such as a liquid crystal display, is a method referred to as a "partial driving control". Referring to FIG. 1, the partial driving control involves dividing an image as a whole into a plurality of partial blocks and controlling brightness of the backlight for each of the partial blocks. FIG. 1 illustrates an example in which the image as a whole is divided into five partial blocks and four partial blocks in a first direction (a horizontal direction X) and a second direction (a vertical direction Y), respectively, to thereby divide the image as a whole into a total of twenty partial blocks.

Referring by way of example to FIG. 2, a light-emission region of the backlight is divided into a plurality of partial light-emission blocks and a light-emission control is performed for each of the partial light-emission blocks upon performing the partial driving control of the backlight. The partial driving control increases light-emission luminance for any partial light-emission block that corresponds to a relatively bright portion of the image, and decreases the light-emission luminance for any partial light-emission block that corresponds to a relatively dark portion of the image. FIG. 2 illustrates an example in which the light-emission region is divided into five partial light-emission blocks and four partial light-emission blocks in the horizontal direction X and the vertical direction Y, respectively, to thereby divide the light-emission region into a total of twenty partial light-emission blocks, such that the light-emission region is divided in a fashion corresponding to that of the example of FIG. 1. It is to be noted that the right side of FIG. 2 illustrates an example of a relative value of the light-emission luminance of each of the partial light-emission blocks; however, the relative values are for reference only and illustrated solely for description purpose.

0.2 Outline of Illumination Unit According to Comparative Example

FIG. 3 illustrates a schematic configuration of an illumination unit 100 according to the comparative example, directed to achievement of the partial driving control illustrated in FIG. 2. FIG. 4 illustrates an example of a circuit configuration of the illumination unit 100 according to the comparative example.

The illumination unit 100 includes a plurality of partial light-emission blocks 101. The partial light-emission blocks 101 are so provided that five partial light-emission blocks 101 and four partial light-emission blocks 101 are disposed in the horizontal direction X and the vertical direction Y, respectively. In other words, a total of twenty partial light-emission blocks 101 are provided in order to achieve the partial driving control illustrated in FIG. 2.

The partial light-emission blocks 101 each include a light-emitting section 30 and a control device 40.

Referring to FIG. 4, the light-emitting section 30 includes at least one light-emitting device 31. For example, the light-emitting device 31 includes a light-emitting diode (LED).

The control device 40 may include, for example, a controlling field-effect transistor (FET) 41 and a current-controlling resistor 42 as illustrated in FIG. 4.

The light-emitting section 30 provided in each of the partial light-emission blocks 101 receives a supply of a voltage through a booster circuit 60.

The booster circuit 60 is a circuit that increases an input voltage Vin to the voltage necessary in the light-emitting section 30. The booster circuit 60 includes an inductor 61, a diode 62, and a switching device 63 such as a metal oxide semiconductor (MOS) FET, for example.

The controlling FET 41 provided in each of the partial light-emission blocks 101 is controlled by a drive circuit 50 that includes an integrated circuit (IC), for example.

It is to be noted that the control device 40 is provided in the light-emitting section 30 of each of the partial light-emission blocks 101. However, it is also possible to provide the control device 40 in the drive circuit 50.

0.3 Issue

For the illumination unit 100 according to the comparative example, it is necessary to provide the control devices 40 and the drive circuits 50 both corresponding to the number of partial light-emission blocks 101, in order to control the light-emission luminance of each of the partial light-emission blocks 101 independently. For example, the control devices 40 that are the same in number as the partial light-emission blocks 101, i.e., five control devices 40 (the number of partial light-emission blocks 101 in the horizontal direction X)×four control devices 40 (the number of partial light-emission blocks 101 in the vertical direction Y)=twenty control devices 40, are necessary. Further, in a case where one drive circuit 50 has a control function corresponding to six channels, for example, five channels may be used by way of example per drive circuit 50 in order to drive the twenty partial light-emission blocks 101, meaning that four drive circuits 50 are necessary in this case (i.e., five channels×four drive circuits 50=twenty partial light-emission blocks 101).

What is therefore desired is a development of a technique that simplifies a circuit configuration directed to the partial driving control.

1. FIRST EMBODIMENT

A description is given next of an illumination unit according to a first embodiment of the present disclosure. It is to be noted that, in the following, the same or equivalent elements as those of the illumination unit according to the foregoing comparative example are denoted with the same reference numerals, and description thereof will be omitted where appropriate.

The first embodiment is described by referring to an example of an illumination unit that allows for the partial driving control performed by substantially twenty partial light-emission blocks 101 as with the illumination unit 100 according to the foregoing comparative example, while simplifying a circuit configuration. It is to be noted that the number of factors to be described below, including the number of partial light-emission blocks 101 to be divided from the light-emission region, are exemplary and are not limited to that described below. In other words, the number of factors, such as the number of partial light-emission blocks 101 to be divided from the light-emission region, may be greater or less than that of an example to be described below. The same is true for other embodiments to be described later.

1.1 Configuration and Operation

Outline of Partial Driving Control

FIGS. 5 and 6 each describe an example of a method of dividing an image performed by a display apparatus according to the first embodiment of the present disclosure.

In the display apparatus according to the present embodiment, an image as a whole is divided in two different directions, i.e., in the first direction (the horizontal direction X) and in the second direction (the vertical direction Y). In other words, the image as a whole is divided into four horizontal image blocks in which the image as a whole is partitioned in the horizontal direction X as illustrated in FIG. 5, and into five vertical image blocks in which the image as a whole is partitioned in the vertical direction Y as illustrated in FIG. 6.

FIG. 7 describes an outline of the partial driving control performed by an illumination unit 1 according to the present embodiment. FIG. 8 illustrates a schematic configuration of the illumination unit 1 according to the present embodiment.

Referring to the upper side of FIG. 7, the light-emission region is divided into two kinds of light-emission blocks, i.e., a plurality of horizontal blocks (first light-emission blocks) 10 and a plurality of vertical blocks (second light-emission blocks) 20 in the illumination unit 1 according to the present embodiment. Further, the light-emission control is performed for each of the horizontal blocks 10 and for each of the vertical blocks 20.

In the illumination unit 1 according to the present embodiment, the light-emission blocks to be actually subjected to the light-emission control are only nine light-emission blocks, i.e. four horizontal blocks 10+five vertical blocks 20, as illustrated on the upper side of FIG. 7. However, as illustrated on the lower side of FIG. 7, the horizontal blocks 10 and the vertical blocks 20 partially overlap with one another respectively to form a total of twenty partial light-emission blocks 101 consequently as with the foregoing comparative example. Thus, luminance of each of the partial light-emission blocks 101 is the sum of luminance of the corresponding horizontal block 10 and luminance of the corresponding vertical block 20 which are overlapped with each other. It is to be noted that FIG. 7 illustrates an example of a relative value of the light-emission luminance of each of the blocks; however, the relative values are for reference only and illustrated solely for description purpose.

Outline of Illumination Unit

Referring to FIG. 8, the illumination unit 1 includes a plurality of light-emitting devices (first light-emitting devices) 31 arranged in the horizontal direction X in each of the horizontal blocks 10, in order to achieve the partial driving control illustrated in FIG. 7. For example, the light-emitting devices 31 each may be an LED chip. Further, each of the horizontal blocks 10 includes a first substrate 33 that extends in the horizontal direction X. The plurality of light-emitting devices 31 is provided on the first substrate 33. The mutually-adjacent light-emitting devices 31 provided on the corresponding first substrate 33 are coupled to one another.

The illumination unit 1 also includes a plurality of light-emitting devices (second light-emitting devices) 32 arranged in the vertical direction Y in each of the vertical blocks 20. For example, the light-emitting devices 32 each may be an LED chip. Further, each of the vertical blocks 20 includes a second substrate 34 that extends in the vertical direction Y. The plurality of light-emitting devices 32 is provided on the second substrate 34. The mutually-adjacent light-emitting devices 32 provided on the corresponding second substrate 34 are coupled to one another.

The illumination unit 1 is so configured that at least one light-emitting device 31 and at least one light-emitting device 32 are disposed in each of the partial light-emission blocks 101 formed by the partial overlapping of the horizontal blocks 10 with the respective vertical blocks 20. The light-emitting device 31 and the light-emitting device 32 disposed in one partial light-emission block 101 form one light-emitting section 30. Thus, the luminance of each of the partial light-emission blocks 101 is the sum of luminance of the light-emitting device 31 and luminance of the light-emitting device 32 which are provided in the corresponding partial light-emission block 101.

Circuit Configuration

FIG. 9 illustrates an example of a circuit configuration of the illumination unit 1.

In the illumination unit 1 according to the present embodiment, the light-emission blocks to be actually subjected to the light-emission control are the four horizontal blocks 10 and the five vertical blocks 20 as described above. The control device 40 and the drive circuit 50 may be each an example of a "light-emission controller" according to the present disclosure. The control device 40 and the drive circuit 50 perform the light-emission control on a horizontal block 10 basis and on a vertical block 20 basis. In a case where the illumination unit 1 is applied to the display apparatus, the drive circuit 50 so variably controls the luminance of the light-emitting section 30 that the light-emitting section 30 emits light at the luminance that is based on an image of a portion corresponding to the partial light-emission block 101 formed by the overlapping of the corresponding horizontal block 10 and the corresponding vertical block 20.

Accordingly, providing the control device 40 for each of the horizontal blocks 10 and each of the vertical blocks 20 suffices. In other words, the number of control devices 40 necessary is only nine, namely, five control devices 40 in the horizontal direction X+four control devices 40 in the vertical direction Y suffice.

Similarly, the number of channels of the drive circuit 50 necessary is only nine in the illumination unit 1 according to the present embodiment (namely, four channels for the horizontal blocks 10+five channels for the vertical blocks 20). In a case where one drive circuit 50 has a control function corresponding to six channels, for example, providing two drive circuits 50 suffices in order to drive the four horizontal blocks 10 and the five vertical blocks 20.

FIG. 10 illustrates an example of a circuit configuration of the illumination unit 1 according to a modification example.

An example of the circuit configuration illustrated in FIG. 9 has a configuration in which the booster circuit 60 is shared by the horizontal blocks 10 and the vertical blocks 20. However, there may be a situation where it is necessary to make a voltage for the horizontal blocks 10 and a voltage for the vertical blocks 20 different from each other in a case where the number of light-emitting devices 31 provided for the horizontal blocks 10 and the number of light-emitting devices 32 provided for the vertical blocks 20 are different from each other. In such a case, a booster circuit 60A directed to the horizontal blocks 10 and a booster circuit 60B directed to the vertical blocks 20 may be provided separately as illustrated in FIG. 10.

It is to be noted that the control device 40 and the drive circuit 50 are provided separately in examples illustrated in FIGS. 9 and 10; however, the control device 40 may be provided in the drive circuit 50.

Any configuration and operation other than those described above may be substantially similar to those of the illumination unit according to the foregoing comparative example.

1.2 Effects

According to the present embodiment, the plurality of horizontal blocks 10 and the plurality of vertical blocks 20 partially overlapped with the respective horizontal blocks 10 are provided as described above. This configuration allows the horizontal blocks 10 and the vertical blocks 20 to be overlapped with one another respectively to form the plurality of partial light-emission blocks 101 in the horizontal direction X and in the vertical direction Y. Hence, it is possible to simplify a circuit configuration directed to the partial driving control.

It is to be noted that the effects described herein are illustrative and non-limiting, and may include effects other than those described above. The same is true for effects that are achieved by other embodiments described hereinafter.

2. SECOND EMBODIMENT

A description is given next of an illumination unit according to a second embodiment of the present disclosure. It is to be noted that the same or equivalent elements as those of the illumination unit according to the foregoing first embodiment are denoted with the same reference numerals, and description thereof will be omitted where appropriate.

In the foregoing first embodiment, the light-emission luminance of each of the light-emission blocks including the horizontal blocks 10 and the vertical blocks 20 is variably controlled. Alternatively, the light-emission control may be so performed that the light-emission luminance of some of the light-emission blocks becomes constant. For example, the drive circuit 50 may so perform the light-emission control that the light-emission luminance of the light-emitting devices 31 belonging to some of the horizontal blocks 10 and the light-emission luminance of the light-emitting devices 32 belonging to some of the vertical blocks 20 to be constant. In this case, the drive circuit 50 variably controls the light-emission luminance of the light-emitting devices 31 belonging to the horizontal blocks 10 other than the some of the horizontal blocks 10, and variably controls the light-emission luminance of the light-emitting devices 32 belonging to the vertical blocks 20 other than the some of the vertical blocks 20. This further simplifies a circuit configuration of the drive circuit 50.

First Example

FIG. 11 illustrates a first example of a method of dividing the light-emission region performed by the illumination unit according to the second embodiment of the present disclosure. FIG. 12 illustrates an outline of a first example of the partial driving control performed by the illumination unit according to the present embodiment.

Referring by way of example to the left side of FIG. 11, the light-emission control may be so performed that the luminance of at least the light-emission blocks, which serve as luminance-fixed horizontal blocks 11, located at both ends in the vertical direction Y out of the horizontal blocks 10 according to the foregoing first embodiment becomes constant continuously. In this case, the light-emission blocks other than the luminance-fixed horizontal blocks 11 out of the horizontal blocks 10 serve as luminance-variable horizontal blocks 12 to variably control the light-emission luminance of the luminance-variable horizontal blocks 12.

Further, as illustrated by way of example on the right side of FIG. 11, at least the light-emission blocks located at both ends in the horizontal direction X out of the vertical blocks 20 according to the foregoing first embodiment serve as luminance-fixed vertical blocks 21. In this case, the light-emission blocks other than the luminance-fixed vertical blocks 21 out of the vertical blocks 20 serve as luminance-variable vertical blocks 22 to variably control the light-emission luminance of the luminance-variable vertical blocks 22.

A total of twenty partial light-emission blocks are formed as with the foregoing first embodiment by combining the light-emission blocks illustrated in FIG. 11. The luminance obtained as a result of the combining in each of the partial light-emission blocks is as illustrated in FIG. 12. The six partial light-emission blocks located in the middle of the twenty partial light-emission blocks each have the combined luminance that is the sum of luminance of the corresponding luminance-variable horizontal block 12 and luminance of the corresponding luminance-variable vertical block 22. Those middle partial light-emission blocks are subjected to the partial driving control by means of the corresponding luminance-variable horizontal blocks 12 and the corresponding luminance-variable vertical blocks 22.

The two partial light-emission blocks in a left end region and the two partial light-emission blocks in a right end region, both located substantially in the middle in the horizontal direction X, each have the combined luminance that is the sum of luminance of the corresponding luminance-variable horizontal block 12 and luminance of the corresponding luminance-fixed vertical block 21. Those partial light-emission blocks located in the left end substantially-middle region and the partial light-emission blocks located in the right end substantially-middle region are subjected to the partial driving control by means of the corresponding luminance-variable horizontal blocks 12.

The three partial light-emission blocks in an upper end region and the three partial light-emission blocks in a lower end region, both located substantially in the middle in the vertical direction Y, each have the combined luminance that is the sum of luminance of the corresponding luminance-fixed horizontal block 11 and luminance of the corresponding luminance-variable vertical block 22. Those partial light-emission blocks located in the upper end substantially-middle region and the partial light-emission blocks located in the lower end substantially-middle region are subjected to the partial driving control by means of the corresponding luminance-variable vertical blocks 22.

The partial light-emission blocks located at four corners each have the combined luminance that is the sum of luminance of the corresponding luminance-fixed horizontal block 11 and luminance of the corresponding luminance-fixed vertical block 21. Those partial light-emission blocks located at the four corners each have the constant luminance continuously without being subjected to the partial driving control. It is to be noted that FIGS. 11 and 12 illustrate an example in which the light-emission control is so performed that the luminance-fixed horizontal blocks 11 and the luminance-fixed vertical blocks 21 each have an intermediate luminance. However, the luminance-fixed horizontal blocks 11 and the luminance-fixed vertical blocks 21 each may be set to have any luminance other than the intermediate luminance.

Second Example

FIG. 13 illustrates a second example of the method of dividing the light-emission region performed by the illumination unit according to the present embodiment. FIG. 14 illustrates an outline of a second example of the partial driving control performed by the illumination unit according to the present embodiment.

In the second example, the light-emission control is so performed that the luminance-fixed horizontal blocks 11 and the luminance-fixed vertical blocks 21 each have maximum luminance continuously. Otherwise, the second example is substantially similar to the foregoing first example.

Third Example

FIG. 15 illustrates a third example of the method of dividing the light-emission region performed by the illumination unit according to the present embodiment. FIG. 16 illustrates an outline of a third example of the partial driving control performed by the illumination unit according to the present embodiment.

Referring by way of example to the left side of FIG. 15, at least the light-emission blocks located at both ends in the vertical direction Y out of the horizontal blocks 10 according to the foregoing first embodiment may serve as non-light-emission horizontal blocks 13. The non-light-emission horizontal blocks 13 each may have a configuration in which the light-emitting device 31 itself is not provided to be unlit continuously. In this case, the light-emission blocks other than the non-light-emission horizontal blocks 13 out of the horizontal blocks 10 serve as the luminance-variable horizontal blocks 12 to variably control the light-emission luminance of the luminance-variable horizontal blocks 12.

Further, as illustrated by way of example on the right side of FIG. 15, at least the light-emission blocks located at both ends in the horizontal direction X out of the vertical blocks 20 according to the foregoing first embodiment serve as the luminance-fixed vertical blocks 21. In this case, the light-emission blocks other than the luminance-fixed vertical blocks 21 out of the vertical blocks 20 serve as the luminance-variable vertical blocks 22 to variably control the light-emission luminance of the luminance-variable vertical blocks 22.

As with the foregoing first embodiment, a total of twenty partial light-emission blocks are formed by combining the light-emission blocks illustrated in FIG. 15. The luminance obtained as a result of the combining in each of the partial light-emission blocks is as illustrated in FIG. 16. The six partial light-emission blocks located in the middle of the twenty partial light-emission blocks each have the combined luminance that is the sum of the luminance of the corresponding luminance-variable horizontal block 12 and the luminance of the corresponding luminance-variable vertical block 22. Those middle partial light-emission blocks are subjected to the partial driving control by means of the corresponding luminance-variable horizontal blocks 12 and the corresponding luminance-variable vertical blocks 22.

The two partial light-emission blocks in a left end region and the two partial light-emission blocks in a right end region, both located substantially in the middle in the horizontal direction X, each have the combined luminance that is the sum of the luminance of the corresponding luminance-variable horizontal block 12 and the luminance of the corresponding luminance-fixed vertical block 21. Those partial light-emission blocks located in the left end substantially-middle region and the partial light-emission blocks located in the right end substantially-middle region are subjected to the partial driving control by means of the corresponding luminance-variable horizontal blocks 12.

The three partial light-emission blocks in an upper end region and the three partial light-emission blocks in a lower end region, both located substantially in the middle in the vertical direction Y, each have the combined luminance that is the sum of luminance of the corresponding non-light-emission horizontal block 13 and the luminance of the corresponding luminance-variable vertical block 22. Thus, the combined luminance of each of those partial light-emission blocks is virtually the same as the luminance derived from the corresponding luminance-variable vertical block 22. Those partial light-emission blocks located in the upper end substantially-middle region and the partial light-emission blocks located in the lower end substantially-middle region are subjected to the partial driving control by means of the corresponding luminance-variable vertical blocks 22.

The partial light-emission blocks located at four corners each have the combined luminance that is the sum of the luminance of the corresponding non-light-emission horizontal block 13 and the luminance of the corresponding luminance-fixed vertical block 21. Thus, the combined luminance of each of those partial light-emission blocks is virtually the same as the luminance derived from the corresponding luminance-fixed vertical block 21. Those partial light-emission blocks located at the four corners each have the constant luminance continuously without being subjected to the partial driving control. It is to be noted that FIGS. 15 and 16 illustrate an example in which the light-emission control is so performed that the luminance-fixed vertical blocks 21 each have the maximum luminance continuously. However, the luminance-fixed vertical blocks 21 each may be set to have any luminance other than the maximum luminance.

Fourth Example

FIG. 17 illustrates a fourth example of the method of dividing the light-emission region performed by the illumination unit according to the present embodiment. FIG. 18 illustrates an outline of a fourth example of the partial driving control performed by the illumination unit according to the present embodiment.

Referring by way of example to the left side of FIG. 17, the light-emission control may be so performed that the luminance of at least the light-emission blocks, which serve as the luminance-fixed horizontal blocks 11, located at both ends in the vertical direction Y out of the horizontal blocks 10 according to the foregoing first embodiment becomes constant continuously. In this case, the light-emission blocks other than the luminance-fixed horizontal blocks 11 out of the horizontal blocks 10 serve as the luminance-variable horizontal blocks 12 to variably control the light-emission luminance of the luminance-variable horizontal blocks 12.

Further, as illustrated by way of example on the right side of FIG. 18, at least the light-emission blocks located at both ends in the horizontal direction X out of the vertical blocks 20 according to the foregoing first embodiment may serve as the non-light-emission vertical blocks 23. The non-light-emission vertical blocks 23 each may have a configuration in which the light-emitting device 32 itself is not provided to be unlit continuously. In this case, the light-emission blocks other than the non-light-emission vertical blocks 23 out of the vertical blocks 20 serve as the luminance-variable vertical blocks 22 to variably control the light-emission luminance of the luminance-variable vertical blocks 22.

As with the foregoing first embodiment, a total of twenty partial light-emission blocks are formed by combining the light-emission blocks illustrated in FIG. 17. The luminance obtained as a result of the combining in each of the partial light-emission blocks is as illustrated in FIG. 18. The six partial light-emission blocks located in the middle of the twenty partial light-emission blocks each have the combined luminance that is the sum of the luminance of the corresponding luminance-variable horizontal block 12 and the luminance of the corresponding luminance-variable vertical block 22. Those middle partial light-emission blocks are subjected to the partial driving control by means of the corresponding luminance-variable horizontal blocks 12 and the corresponding luminance-variable vertical blocks 22.

The two partial light-emission blocks in a left end region and the two partial light-emission blocks in a right end region, both located substantially in the middle in the horizontal direction X, each have the combined luminance that is the sum of the luminance of the corresponding luminance-variable horizontal block 12 and the luminance of the corresponding non-light-emission vertical block 23. Thus, the combined luminance of each of those partial light-emission blocks is virtually the same as the luminance derived from the corresponding luminance-variable horizontal block 12. Those partial light-emission blocks located in the left end substantially-middle region and the partial light-emission blocks located in the right end substantially-middle region are subjected to the partial driving control by means of the corresponding luminance-variable horizontal blocks 12.

The three partial light-emission blocks in an upper end region and the three partial light-emission blocks in a lower end region, both located substantially in the middle in the vertical direction Y, each have the combined luminance that is the sum of the luminance of the corresponding luminance-fixed horizontal block 11 and the luminance of the corresponding luminance-variable vertical block 22. Those partial light-emission blocks located in the upper end substantially-middle region and the partial light-emission blocks located in the lower end substantially-middle region are subjected to the partial driving control by means of the corresponding luminance-variable vertical blocks 22.

The partial light-emission blocks located at four corners each have the combined luminance that is the sum of the luminance of the corresponding luminance-fixed horizontal block 11 and the luminance of the non-light-emission vertical block 23. Thus, the combined luminance of each of those partial light-emission blocks is virtually the same as the luminance derived from the corresponding luminance-fixed horizontal block 11. Those partial light-emission blocks located at the four corners each have the constant luminance continuously without being subjected to the partial driving control. It is to be noted that FIGS. 17 and 18 illustrate an example in which the light-emission control is so performed that the luminance-fixed horizontal blocks 11 each have the maximum luminance continuously. However, the luminance-fixed horizontal blocks 11 each may be set to have any luminance other than the maximum luminance.

Any configuration, operation, and effect other than those described above may be substantially similar to those of the illumination unit according to the foregoing comparative example, or substantially similar to those of the illumination unit according to the foregoing first embodiment.

3. THIRD EMBODIMENT

A description is given next of an illumination unit according to a third embodiment of the present disclosure. It is to be noted that the same or equivalent elements as those of the illumination unit according to the foregoing first embodiment or the foregoing second embodiment are denoted with the same reference numerals, and description thereof will be omitted where appropriate.

FIG. 19 schematically illustrates an LED package 70 to be used for an illumination unit 1A according to a third embodiment of the present disclosure. FIG. 20 illustrates an equivalent circuit of the LED package 70 illustrated in FIG. 19.

The LED package 70 has a configuration in which at least one first LED chip 71 and at least one second LED chip 72 are packaged into a single package.

The first LED chip 71 and the second LED chip 72 are sealed on a substrate 73 by a sealing member 80. For example, the first LED chip 71 and the second LED chip 72 each may be a blue LED chip. The sealing member 80 may be a transparent resin material, for example. The sealing member 80 may contain a yellow phosphor that is dispersed therein and emits yellow light, for example. The LED package 70 may emit white light obtained as a result of a combination of blue light derived from the blue LED chip and the yellow light derived from the yellow phosphor, for example. The sealing member 80 may contain a diffusing agent that is dispersed therein and serves to diffuse light.

The first LED chip 71 is coupled to an anode 81 and a cathode 83. A first drive current IF1 flows between the anode 81 and the cathode 83. The second LED chip 72 is coupled to an anode 82 and a cathode 84. A second drive current IF2 flows between the anode 82 and the cathode 84. The second drive current IF2 is independent of the first drive current IF1, allowing the first LED chip 71 and the second LED chip 72 to be subjected to the light-emission control independently.

FIG. 21 schematically illustrates the illumination unit 1A according to the present embodiment in which the LED package 70 illustrated in FIG. 19 is used.

At least one LED package 70 is disposed in each of the partial light-emission blocks 101 formed by the partial overlapping of the horizontal blocks 10 with the respective vertical blocks 20. In this case, configuring respectively the light-emitting device 31 and the light-emitting device 32 illustrated in FIG. 8 by the first LED chip 71 and the second LED chip 72 allows the light-emitting section 30 disposed per partial light-emission block 101 to be configured by at least one LED package 70, thereby making it possible to achieve an illumination unit equal to the illumination unit 1 according to the foregoing first embodiment illustrated in FIG. 8 by, for example, the configuration of the illumination unit 1A illustrated in FIG. 21.

FIG. 21 illustrates an example of the illumination unit 1A in which one LED package 70 is disposed for one partial light-emission block 101. The illumination unit 1A includes a plurality of LED substrates 74 extending in the horizontal direction X. The LED substrates 74 each have the plurality of LED packages 70.

The first LED chips 71 provided in the respective LED packages 70 adjacent to one another in the horizontal direction X are coupled to one another in each of the LED substrates 74. Thus, the plurality of first LED chips 71 is arranged in one horizontal block 10.

Further, the second LED chips 72 provided in the respective LED packages 70 adjacent to one another in the vertical direction Y are coupled to one another by a wiring line 75. Thus, the plurality of second LED chips 72 is arranged in one vertical block 20.

Any configuration, operation, and effect other than those described above may be substantially similar to those of the illumination unit according to the foregoing comparative example, the foregoing first embodiment, or the foregoing second embodiment.

4. FOURTH EMBODIMENT

A description is given next of an illumination unit according to a fourth embodiment of the present disclosure. It is to be noted that the same or equivalent elements as those of the illumination unit according to any of the foregoing first embodiment to the foregoing third embodiment are denoted with the same reference numerals, and description thereof will be omitted where appropriate.

FIG. 22 schematically illustrates an illumination unit 1B according to a fourth embodiment of the present disclosure. FIG. 23 schematically illustrates the horizontal blocks 10 in the illumination unit 1B. FIG. 24 schematically illustrates the vertical blocks 20 in the illumination unit 1B. FIG. 25 schematically illustrates the partial light-emission blocks 101 formed by the illumination unit 1B. It is to be noted that elements such as a wiring line that couples the mutually-adjacent LED packages 70 together are unillustrated in FIGS. 22 to 25.

The illumination unit 1B has a configuration in which the plurality of LED packages 70 is used as with the illumination unit 1A according to the foregoing third embodiment. Upon using the LED packages 70, it is preferable that the number of first LED chips 71 included in one horizontal block 10 and the number of second LED chips 72 included in one vertical block 20 be the same as each other. In a case where the number of first LED chips 71 included in one horizontal block 10 and the number of second LED chips 72 included in one vertical block 20 are different from each other, separate booster circuits may be necessary as illustrated in an example of a circuit configuration of FIG. 10. In other words, the booster circuit 60A directed to the horizontal blocks 10 and the booster circuit 60B directed to the vertical blocks 20 may be provided separately. Causing the number of first LED chips 71 included in one horizontal block 10 and the number of second LED chips 72 included in one vertical block 20 to be the same as each other allows for a configuration in which the booster circuit 60 that is shared by the horizontal blocks 10 and the vertical blocks 20 is used as illustrated in an example of a circuit configuration of FIG. 9.

FIG. 22 illustrates an example of a configuration in which ten LED packages 70 are disposed in the horizontal direction X and five LED packages 70 are disposed in the vertical direction Y. If the first LED chips 71 provided in the ten LED packages 70 belonging to one row in the horizontal direction X are assumed to form one horizontal block 10 and the second LED chips 72 provided in the five LED packages 70 belonging to one column in the vertical direction Y are assumed to form one vertical block 20, the number of first LED chips 71 included in that one horizontal block 10 and the number of second LED chips 72 included in that one vertical block 20 are different from each other.

In this case, it is preferable that the second LED chips 72 provided in ten LED packages 70 belonging to two columns in the vertical direction Y serve as one vertical block 20. This allows the number of first LED chips 71 included in one horizontal block 10 and the number of second LED chips 72 included in one vertical block 20 to be the same as each other.

This configuration forms five horizontal blocks 10 (H0 to H4) and five vertical blocks 20 (V0 to V4) in the illumination unit 1B. Those five horizontal blocks 10 (H0 to H4) and those five vertical blocks 20 (V0 to V4) partially overlap with one another respectively to form a total of twenty-five partial light-emission blocks 101 as illustrated in FIG. 25. One partial light-emission block 101 includes two LED packages 70 disposed therein. Thus, two first LED chips 71 and two second LED chips 72 are disposed in one partial light-emission block 101.

Accordingly, the number of control devices 40 necessary is only ten in the illumination unit 1B according to the present embodiment (namely, five control devices 40 in the horizontal direction X+four control devices 40 in the vertical direction Y).

Similarly, the number of channels of the drive circuit 50 necessary is only ten in the illumination unit 1B according to the present embodiment (namely, five channels for the horizontal blocks 10+five channels for the vertical blocks 20). This means that, in a case where one drive circuit 50 has a control function corresponding to six channels, for example, providing two drive circuits 50 suffices in order to drive the five horizontal blocks 10 and the five vertical blocks 20.

Any configuration, operation, and effect other than those described above may be substantially similar to those of the illumination unit according to the foregoing comparative example, or those of the illumination unit according to any of the foregoing first embodiment to the foregoing third embodiment.

5. FIFTH EMBODIMENT

A description is given next of an application example of an illumination unit according to a fifth embodiment of the present disclosure. It is to be noted that the same or equivalent elements as those of the illumination unit according to any of the foregoing first embodiment to the foregoing fourth embodiment are denoted with the same reference numerals, and description thereof will be omitted where appropriate.

FIG. 26 schematically illustrates a display apparatus 301 according to a fifth embodiment of the present disclosure. FIG. 27 illustrates an example of an internal configuration of the display apparatus 301 according to the present embodiment.

The display apparatus 301 may be a television apparatus, for example. Referring to FIG. 26, the display apparatus 301 includes a display section 302 and a stand 303.

Referring by way of example to FIG. 27, the display section 302 includes a display panel 200, an illumination unit 201, and a plurality of optical sheets disposed between the display panel 200 and the illumination unit 201. For example, the optical sheets may include a diffusion plate 202, a diffusion sheet 203, a prism sheet 204, and a polarization reflection sheet 205.

The display panel 200 may be a transmissive liquid crystal display panel, for example. The display panel 200 allows an image to be displayed on the basis of illumination light derived from the illumination unit 201 that serves as a backlight. The optical sheets may be provided to uniformize a luminance distribution of the illumination light and increase use efficiency of the illumination light.

The illumination unit 201 includes a frame 211 and a reflection sheet 212 provided on a surface of the frame 211.

The illumination unit 201 also includes a plurality of LED substrates 213 disposed on the surface of the frame 211 with the reflection sheet 212 interposed in between. The LED substrates 213 are each provided with a plurality of LED packages 214 and light source lenses 215 disposed on the respective LED packages 214.

For the LED package 214, a configuration substantially similar to that of the LED package 70 (FIG. 19) of the illumination unit according to the foregoing third embodiment is applicable. One LED package 214 includes at least two LED chips provided therein. At least one LED chip and at least one LED chip provided respectively in one LED package 214 and another LED package 214 that are adjacent to each other on the same LED substrate 213 are coupled to each other. Further, another at least one LED chip and another at least one LED chip provided respectively in one LED package 214 and another LED package 214 that are adjacent to each other in the same direction between the plurality of LED substrates 213 are coupled to each other by a conduction line 216. This configuration allows for application, to the illumination unit 201, of a method of a partial driving control that is substantially similar to that of the illumination unit according to any of the foregoing first embodiment to the foregoing fourth embodiment.

It is to be noted that the illumination unit according to the present disclosure is applicable to a display apparatus other than that used for a television. For example, it is possible to apply the illumination unit as a backlight of a display section of any of various monitors and mobile terminals. It is also possible to apply the illumination unit according to the present disclosure for illumination purpose other than the display apparatus purpose.

Any configuration, operation, and effect other than those described above may be substantially similar to those of the illumination unit according to the foregoing comparative example, or those of the illumination unit according to any of the foregoing first embodiment to the foregoing fourth embodiment.

6. OTHER EMBODIMENTS

A technique according to the present disclosure may be variously modified for implementation without being limited to any of the embodiments described above.

For example, the foregoing third embodiment has been described by referring to an example in which the light-emitting section 30 is configured by the LED package 70. However, unpackaged bare chip LEDs may be used instead of the LED package 70.

For example, the present technology may also include the following configurations.

(1) An illumination unit including:
    a plurality of first light-emission blocks each including a plurality of first light-emitting devices arranged in a first direction;
    a plurality of second light-emission blocks partially overlapped with the respective first light-emission blocks, and each including a plurality of second light-emitting devices arranged in a second direction different from the first direction; and
    a light-emission controller that performs light-emission control of the first light-emitting devices for each of the first light-emission blocks, and performs the light-emission control of the second light-emitting devices for each of the second light-emission blocks.

(2) The illumination unit according to (1), in which the first light-emission blocks and the second light-emission blocks are overlapped with one another respectively to form a plurality of partial light-emission blocks in the first direction and the second direction.

(3) The illumination unit according to (2), in which one or more of the first light-emitting devices and one or more of the second light-emitting devices are disposed in each of the partial light-emission blocks.

(4) The illumination unit according to (3), in which the first light-emitting device and the second light-emitting device disposed in the partial light-emission block are packaged into one package while being allowed to be subjected to the light-emission control independently of each other.

(5) The illumination unit according to (3) or (4), in which
the first light-emitting devices include first LED chips,
the second light-emitting devices include second LED chips subjected to the light-emission control independently of the first LED chips, and
at least one LED package in which one or more of the first LED chips and one or more of the second LED chips are packaged into one package is disposed in each of the partial light-emission blocks.

(6) The illumination unit according to any one of (3) to (5), in which the partial light-emission block has luminance that is sum of light-emission luminance of the first light-emitting device disposed in the partial light-emission block and light-emission luminance of the second light-emitting device disposed in the partial light-emission block.

(7) The illumination unit according to any one of (3) to (6), in which the light-emission controller
performs the light-emission control to allow light-emission luminance of the first light-emitting device provided in some of the first light-emission blocks of the plurality of first light-emission blocks and light-emission luminance of the second light-emitting device provided in some of the second light-emission blocks of the plurality of second light-emission blocks to be constant, and
variably controls light-emission luminance of the first light-emitting device provided in the first light-emission blocks other than the some of the first light-emission blocks and light-emission luminance of the second light-emitting device provided in the second light-emission blocks other than the some of the second light-emission blocks.

(8) The illumination unit according to (7), in which the first light-emission blocks are provided side-by-side in the second direction, and include light-emission blocks located at least at both ends in the second direction of the first light-emission blocks, the light-emission blocks serving as the some of the first light-emission blocks.

(9) The illumination unit according to (7) or (8), in which the second light-emission blocks are provided side-by-side in the first direction, and include light-emission blocks located at least at both ends in the first direction of the second light-emission blocks, the light-emission blocks serving as the some of the second light-emission blocks.

(10) The illumination unit according to (7), further including, in place of the some of the first light-emission blocks or the some of the second light-emission blocks, a plurality of non-light-emission blocks partially overlapped with the respective second light-emission blocks or the respective first light-emission blocks,
in which the light-emission controller performs the light-emission control to allow the light-emission luminance of the first light-emitting device provided in the some of the first light-emission blocks or the second light-emitting device provided in the some of the second light-emission blocks to be constant.

(11) A display apparatus including:
an illumination unit; and
a display panel that displays an image on a basis of illumination light derived from the illumination unit,
the illumination unit including
a plurality of first light-emission blocks each including a plurality of first light-emitting devices arranged in a first direction,
a plurality of second light-emission blocks partially overlapped with the respective first light-emission blocks, and each including a plurality of second light-emitting devices arranged in a second direction different from the first direction, and
a light-emission controller that performs light-emission control of the first light-emitting devices for each of the first light-emission blocks, and performs the light-emission control of the second light-emitting devices for each of the second light-emission blocks.

It should be understood by those skilled in the art that various modifications, combinations, sub-combinations, and alterations may occur depending on design requirements and other factors insofar as they are within the scope of the appended claims or the equivalents thereof.

The invention claimed is:

1. An illumination unit comprising:
a plurality of first light-emission blocks each including a plurality of first light-emitting devices;
a plurality of second light-emission blocks each including a plurality of second light-emitting devices;
a light-emission controller that performs light-emission control of the first light-emitting devices for each of the first light-emission blocks, and performs light-emission control of the second light-emitting devices for each of the second light-emission blocks;
a light-emitting section provided in each of the first light-emission blocks and each of the second light emission blocks receives a supply of a voltage through a booster circuit; and
the booster circuit being shared by the first light-emission blocks and the second light-emission blocks;
wherein a light-emitting device package having a configuration in which at least one first light-emitting device and at least one second light-emitting device are packaged into one package, the number of the first light-emitting devices included in one first light-emission block and the number of second light-emitting devices included in one second light-emission block being the same as each other.

2. The illumination unit according to claim 1, wherein a light-emission block has luminance that is a sum of light-emission luminance of the first light-emitting device disposed in the first light-emission block and light-emission luminance of the second light-emitting device disposed in the second light-emission block.

3. The illumination unit according to claim 1, wherein the first light-emitting devices comprise first LED chips, the second light-emitting devices comprise second LED chips subjected to the light-emission control independently of the first LED chips, and at least one LED package in which one or more of the first LED chips and one or more of the second LED chips are packaged into one package is disposed in each of the light-emission blocks.

4. The illumination unit according to claim 1, wherein the first light-emitting device and the second light-emitting device are sealed on a substrate by a sealing member, and the sealing member contains a resin material and a phosphor.

5. The illumination unit according to claim 4, wherein at least one of the first light-emitting device and the second light-emitting device is a blue LED chip, and the sealing member is a transparent resin material.

6. The illumination unit according to claim 4, wherein at least one of the first light-emitting device and the second light-emitting device is a blue LED chip, the phosphor is a yellow phosphor, and the LED package emits white light obtained as a result of a combination of blue light derived from the blue LED chip and yellow light derived from the yellow phosphor.

7. A display apparatus comprising:
an illumination unit; and
a display panel that displays an image on a basis of illumination light derived from the illumination unit, the illumination unit including
a plurality of first light-emission blocks each including a plurality of first light-emitting devices;
a plurality of second light-emission blocks each including a plurality of second light-emitting devices;
a light-emission controller that performs light-emission control of the first light-emitting devices for each of the first light-emission blocks, and performs light-emission control of the second light-emitting devices for each of the second light-emission blocks;
a light-emitting section provided in each of the first light-emission blocks and each of the second light emission blocks receives a supply of a voltage through a booster circuit; and
the booster circuit being shared by the first light-emission blocks and the second light-emission blocks;
wherein a light-emitting device package having a configuration in which at least one first light-emitting device and at least one second light-emitting device are packaged into one package, the number of the first light-emitting devices included in one first light-emission block and the number of second light-emitting devices included in one second light-emission block being the same as each other.

8. The display apparatus according to claim 7, wherein a light-emission block has luminance that is a sum of light-emission luminance of the first light-emitting device disposed in the first light-emission block and light-emission luminance of the second light-emitting device disposed in the second light-emission block.

9. The display apparatus according to claim 7, wherein the first light-emitting devices comprise first LED chips, the second light-emitting devices comprise second LED chips subjected to the light-emission control independently of the first LED chips, and at least one LED package in which one or more of the first LED chips and one or more of the second LED chips are packaged into one package is disposed in each of the light-emission blocks.

10. The display apparatus according to claim 7, wherein the first light-emitting device and the second light-emitting device are sealed on a substrate by a sealing member, and the sealing member contains a resin material and a phosphor.

11. The display apparatus according to claim 10, wherein at least one of the first light-emitting device and the second light-emitting device is a blue LED chip, and the sealing member is a transparent resin material.

12. The display apparatus according to claim 10, wherein at least one of the first light-emitting device and the second light-emitting device is a blue LED chip, the phosphor is a yellow phosphor, and the LED package emits white light obtained as a result of a combination of blue light derived from the blue LED chip and yellow light derived from the yellow phosphor.

13. A display apparatus comprising:
an illumination unit;
a reflection sheet over the illumination unit;
optical sheets over the reflection sheet; and
a display panel over the optical sheets that displays an image on a basis of illumination light derived from the illumination unit,
the illumination unit including
a plurality of first light-emission blocks each including a plurality of first light-emitting devices arranged in a first direction, and
a plurality of second light-emission blocks partially overlapped with the respective first light-emission blocks, and each including a plurality of second light-emitting devices arranged in a second direction different from the first direction;
wherein the first light-emission blocks and the second light-emission blocks are overlapped with one another respectively to form a plurality of partial light-emission blocks in the first direction and the second direction, one or more of the first light-emitting devices and one or more of the second light-emitting devices are disposed in each of the partial light-emission blocks, and the first light-emitting device and the second light-emitting device disposed in the partial light-emission block are packaged into one package while being allowed to be subjected to the light-emission control independently of each other.

14. The display apparatus according to claim 13, wherein the first light-emitting device and the second light-emitting device are sealed on a substrate by a sealing member, and the sealing member contains a resin material and a phosphor.

15. The display apparatus according to claim 14, wherein at least one of the first light-emitting device and the second light-emitting device is a blue LED chip and the phosphor is a yellow phosphor, and the LED package emits white light obtained as a result of a combination of blue light derived from the blue LED chip and the yellow light derived from the yellow phosphor.

16. The display apparatus according to claim 13, wherein at least one of the first light-emitting device and the second light-emitting device is a blue LED chip, wherein a yellow phosphor covers the at least one of the first light-emitting device and the second light-emitting device, and wherein the partial light-emission blocks are LED packages that emit white light obtained as a result of a combination of blue light derived from the blue LED chip and the yellow light derived from the yellow phosphor.

* * * * *